(12) United States Patent
Tanaka et al.

(10) Patent No.: US 6,468,840 B2
(45) Date of Patent: Oct. 22, 2002

(54) ACTIVE MATRIX SUBSTRATE AND MANUFACTURING METHOD THEREOF

(75) Inventors: Hiroaki Tanaka, Tokyo; Hiroyuki Uchida, Kagoshima, both of (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/841,074

(22) Filed: Apr. 25, 2001

(65) Prior Publication Data

US 2001/0035527 A1 Nov. 1, 2001

(30) Foreign Application Priority Data

Apr. 28, 2000 (JP) ........................................ 2000-129820

(51) Int. Cl.[7] ........................ H01L 21/00; H01L 21/84; H01L 21/302; H01L 21/461
(52) U.S. Cl. ........................ 438/149; 438/29; 438/736; 438/738
(58) Field of Search .......................... 438/149, 27, 736, 438/738, 22, 30, 164, 474, 694, 712, 735, 737, 942

(56) References Cited

U.S. PATENT DOCUMENTS 6,355,942 B1 * 3/2002 Yamazaki et al. ............ 257/72
6,380,006 B2 * 4/2002 Kido .......................... 438/148
2001/0005294 A1 * 6/2001 Yamaguchi et al. .......... 349/39
2002/0009890 A1 * 1/2002 Hayase et al. ............... 438/706

FOREIGN PATENT DOCUMENTS

| JP | 63-218925 | 9/1988 |
| JP | 10-268353 | 10/1998 |
| JP | 2000-66240 | 3/2000 |

OTHER PUBLICATIONS

"Technical Report", 1999, *FPD Intelligence* pp. 31–35.

* cited by examiner

Primary Examiner—Michael S. Lebentritt
Assistant Examiner—Adam Pyonin
(74) Attorney, Agent, or Firm—Young & Thompson

(57) ABSTRACT

As a configuration of a gate island consisting of a laminated structure including a gate electrode, a gate insulating film and a semiconductor film for constituting a thin film transistor, the gate insulating film and the semiconductor film are formed into a plane shape equal to or smaller than the gate electrode and covered with a channel protection film. Further, a drain electrode and a source electrode are formed to be connected with the semiconductor film through openings provided to the channel protection film. Consequently, side surfaces of the semiconductor film and the gate insulating film can be covered with the channel protection film formed in an upper layer, and impurities existing in a liquid crystal layer can be prevented from entering the semiconductor film by diffusion or an electric field, thereby improving the characteristic of a TFT.

12 Claims, 50 Drawing Sheets

Fig.4

(FIRST EMBODIMENT)

---

(FIRST PR STEP)

- Ti/Al-SP
- a-Si/SiN-CVD
- PR COATING/HALF-TONE EXPOSURE/DEVELOPMENT
- a-Si/SiN-DE
- Ti/Al-DE, $O_2$ ASHING
- a-Si/SiN-DE
- RESIST REMOVING

↓

(SECOND PR STEP)

- SiN-CVD
- ITO-SP
- PR COATING/HALF-TONE EXPOSURE/DEVELOPMENT
- ITO-WE
- SiN-DE, $O_2$ ASHING
- ITO-WE
- RESIST REMOVING

↓

(THIRD PR STEP)

- $PH_3$ PROCESSING OR $n^+$ TYPE a-Si-CVD
- Cr-SP
- SiN-CVD
- PR COATING/EXPOSURE/DEVELOPMENT
- SiN-DE
- Cr-WE
- RESIST REMOVING

---

SP: SPUTTER
WE: WET ETCHING
DE: DRY ETCHING
CVD: CHEMICAL VAPOR DEPOSITION

Fig.6(a)
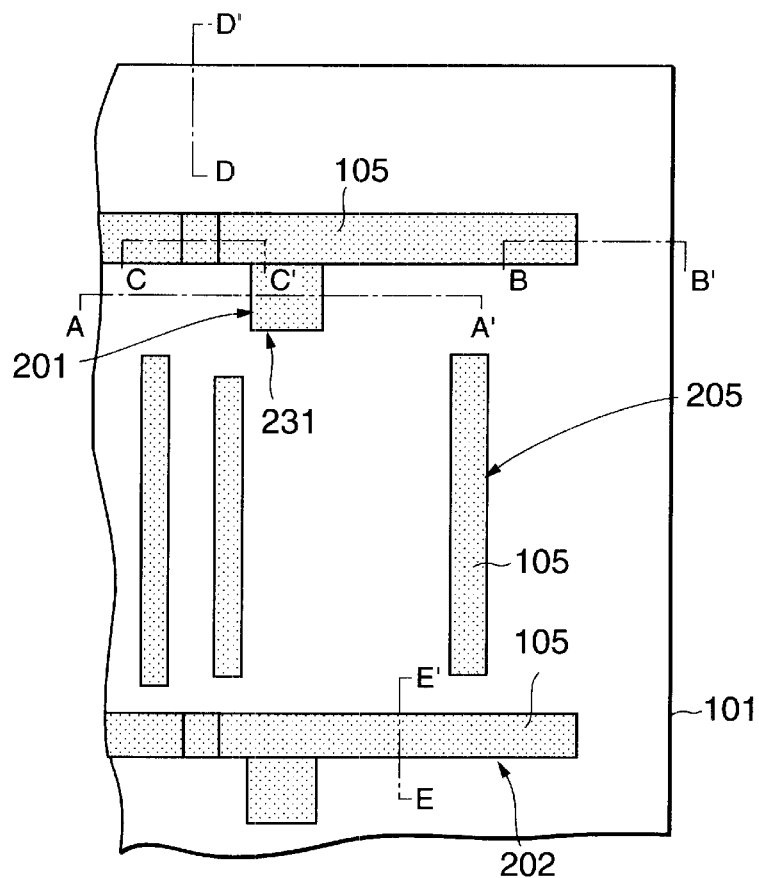
Fig.6(b)  Fig.6(c)
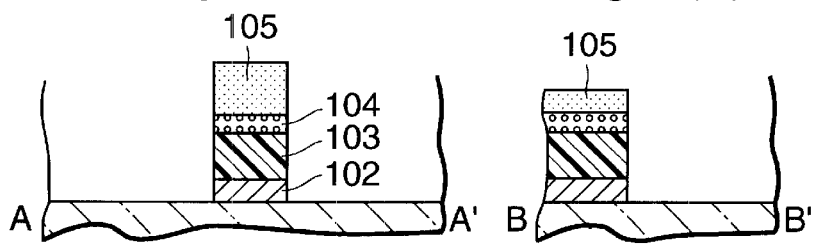
Fig.6(d)  Fig.6(e)  Fig.6(f)
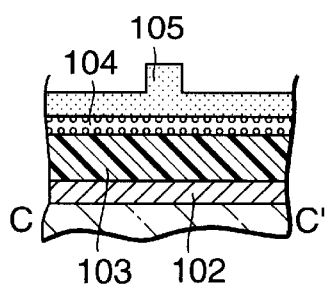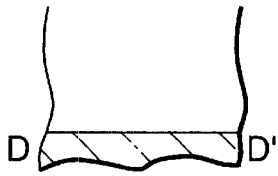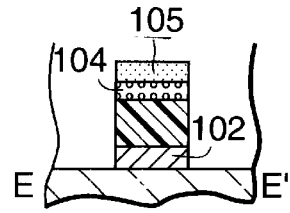

Fig.8(a)
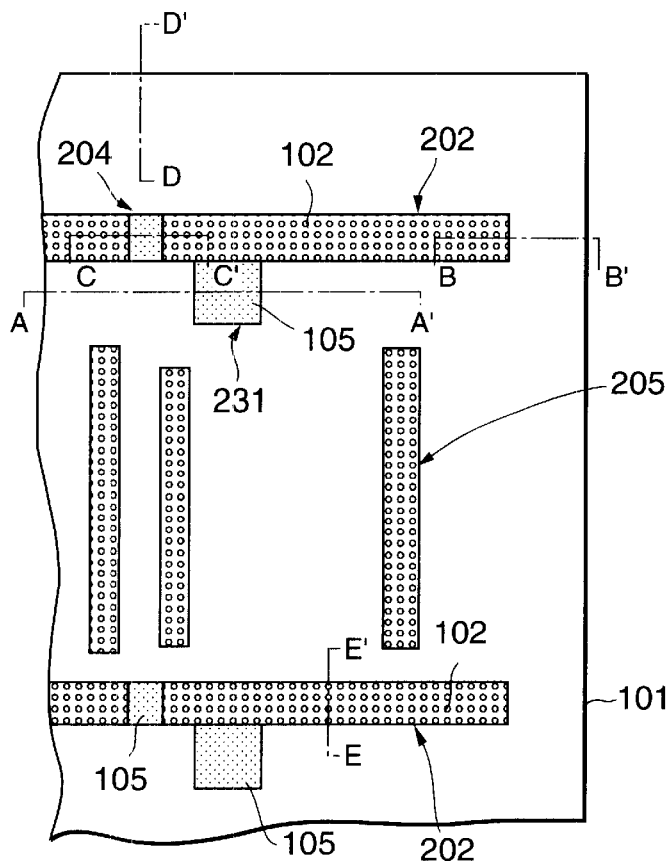
Fig.8(b)  Fig.8(c)
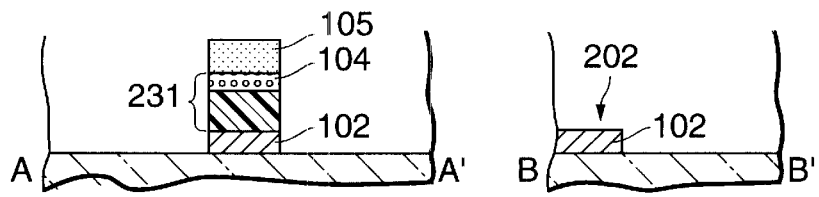
Fig.8(d)  Fig.8(e)  Fig.8(f)
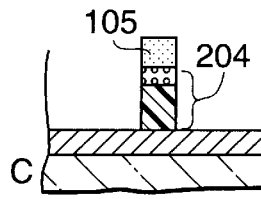  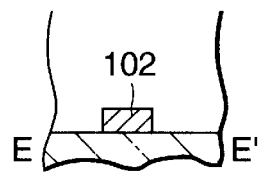

Fig.10(a)
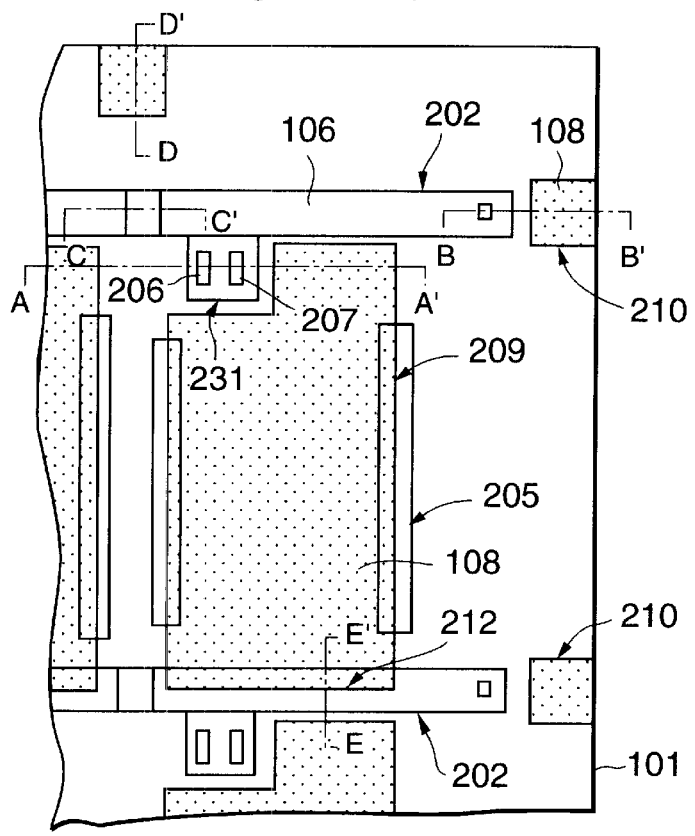
Fig.10(b)    Fig.10(c)
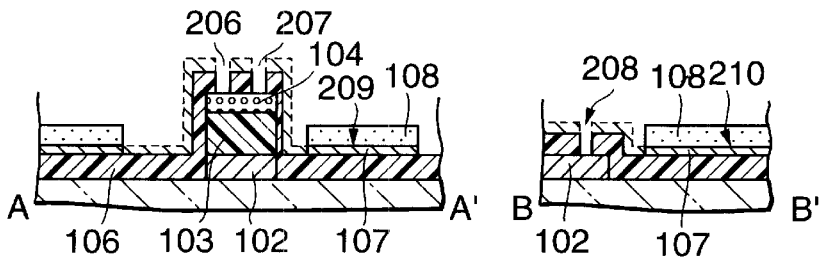
Fig.10(d)   Fig.10(e)   Fig.10(f)
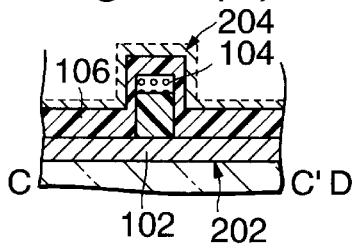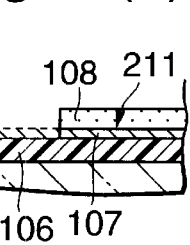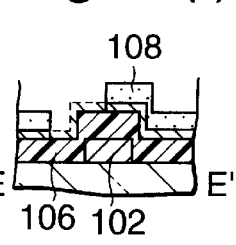

Fig.11(a)
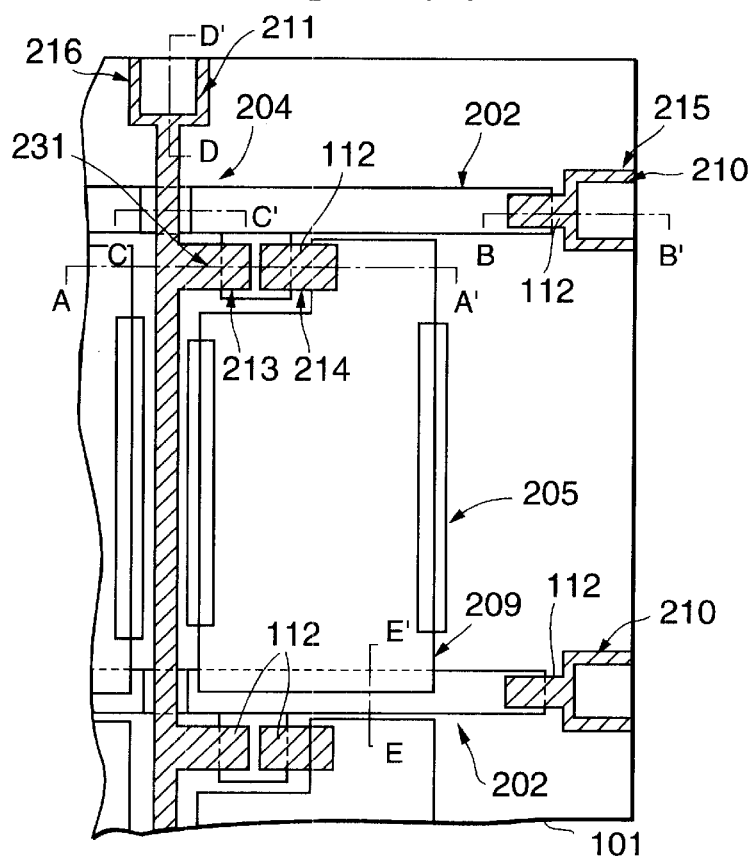
Fig.11(b)
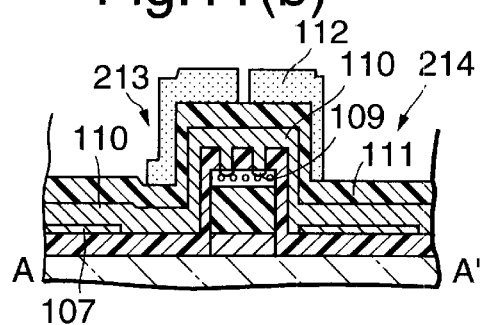
Fig.11(c)
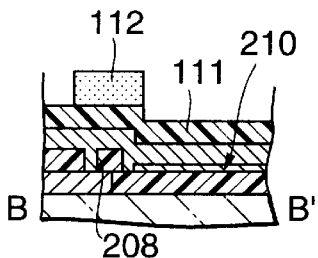
Fig.11(d)    Fig.11(e)    Fig.11(f)
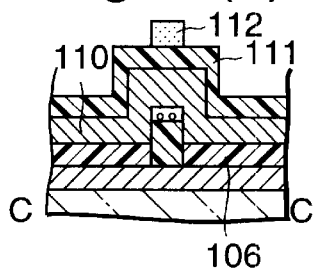 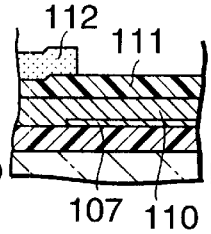 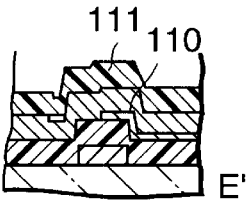

Fig.13

(SECOND EMBODIMENT)

---

(FIRST PR STEP)

- Ti/Al-SP
- a-Si/SiN-CVD
- PR COATING/HALF-TONE EXPOSURE/DEVELOPMENT
- a-Si/SiN-DE
- Ti/Al-DE, $O_2$ ASHING
- a-Si/SiN-DE
- RESIST REMOVING

↓

(SECOND PR STEP)

- SiN-CVD
- ITO-SP
- PR COATING/HALF-TONE EXPOSURE/DEVELOPMENT
- ITO-WE
- SiN-DE, $O_2$ ASHING
- ITO-WE
- RESIST REMOVING

↓

(THIRD PR STEP)

- $PH_3$ PROCESSING OR $n^+$ TYPE a-Si-CVD
- Cr-SP
- SiN-CVD
- PR COATING/EXPOSURE/DEVELOPMENT
- SiN-DE
- Cr-WE
- RESIST REMOVING

---

SP:SPUTTER
WE:WET ETCHING
DE:DRY ETCHING
CVD:CHEMICAL VAPOR DEPOSITION

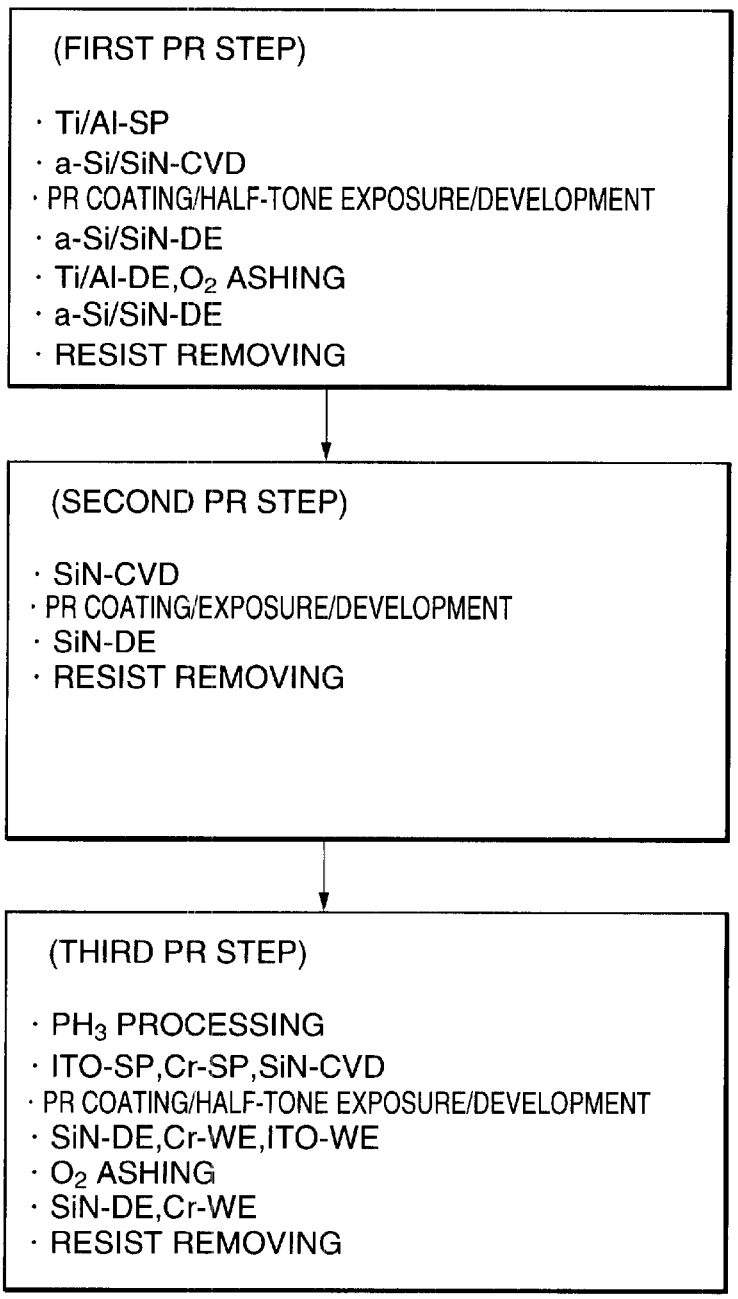

Fig.17

(THIRD EMBODIMENT)

(FIRST PR STEP)

- Ti/Al-SP
- a-Si/SiN-CVD
- PR COATING/HALF-TONE EXPOSURE/DEVELOPMENT
- a-Si/SiN-DE
- Ti/Al-DE, $O_2$ ASHING
- a-Si/SiN-DE
- RESIST REMOVING (SECOND PR STEP)

- SiN-CVD
- PR COATING/EXPOSURE/DEVELOPMENT
- SiN-DE
- RESIST REMOVING (THIRD PR STEP)

- $PH_3$ PROCESSING
- ITO-SP, Cr-SP, SiN-CVD
- PR COATING/HALF-TONE EXPOSURE/DEVELOPMENT
- SiN-DE, Cr-WE, ITO-WE
- $O_2$ ASHING
- SiN-DE, Cr-WE
- RESIST REMOVING

SP: SPUTTER
WE: WET ETCHING
DE: DRY ETCHING
CVD: CHEMICAL VAPOR DEPOSITION

Fig.21

(FOURTH EMBODIMENT)

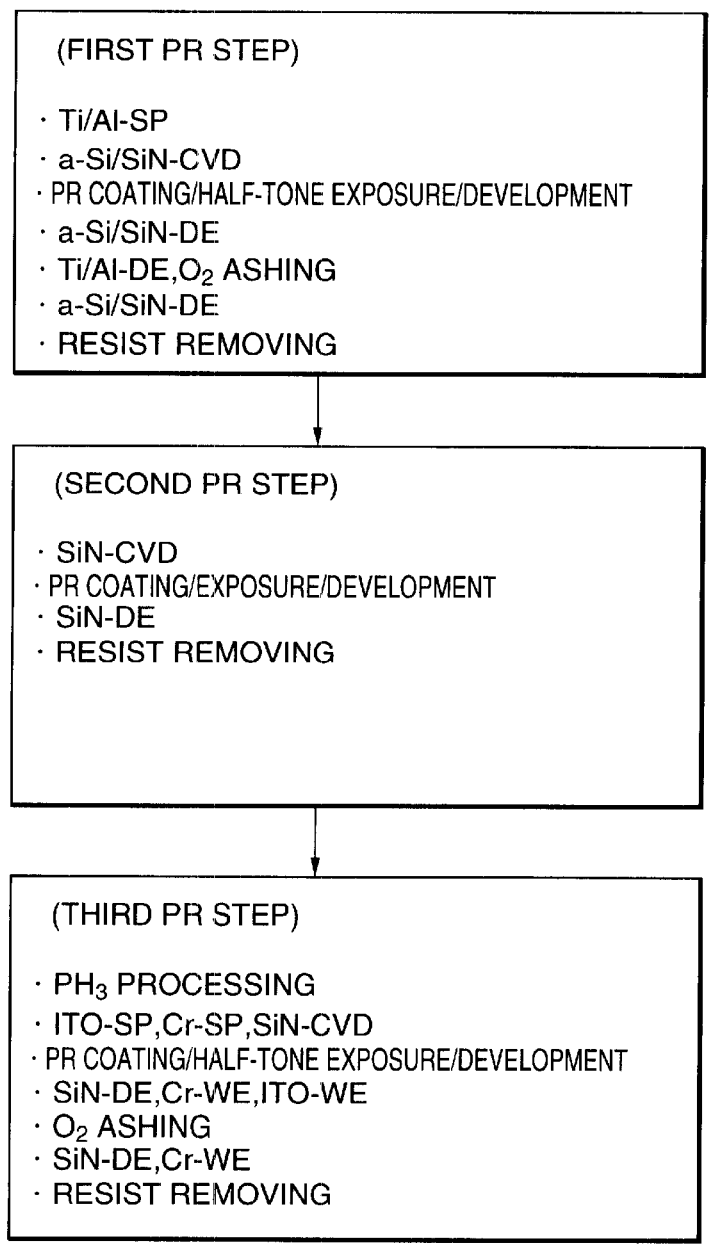

(FIRST PR STEP)

· Ti/Al-SP
· a-Si/SiN-CVD
· PR COATING/HALF-TONE EXPOSURE/DEVELOPMENT
· a-Si/SiN-DE
· Ti/Al-DE,$O_2$ ASHING
· a-Si/SiN-DE
· RESIST REMOVING (SECOND PR STEP)

· SiN-CVD
· PR COATING/EXPOSURE/DEVELOPMENT
· SiN-DE
· RESIST REMOVING (THIRD PR STEP)

· $PH_3$ PROCESSING
· ITO-SP,Cr-SP,SiN-CVD
· PR COATING/HALF-TONE EXPOSURE/DEVELOPMENT
· SiN-DE,Cr-WE,ITO-WE
· $O_2$ ASHING
· SiN-DE,Cr-WE
· RESIST REMOVING

SP:SPUTTER
WE:WET ETCHING
DE:DRY ETCHING
CVD:CHEMICAL VAPOR DEPOSITION (FIFTH EMBODIMENT)

SP:SPUTTER
WE:WET ETCHING
DE:DRY ETCHING
CVD:CHEMICAL VAPOR DEPOSITION

Fig.27(a)
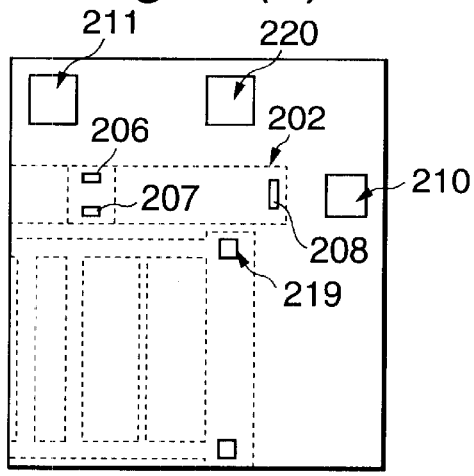
Fig.27(b)           Fig.27(c)
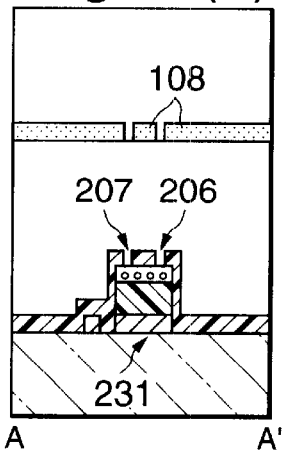   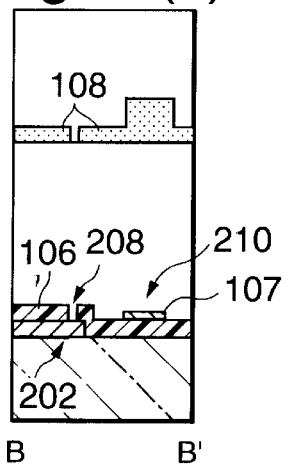
Fig.27(d)           Fig.27(e)
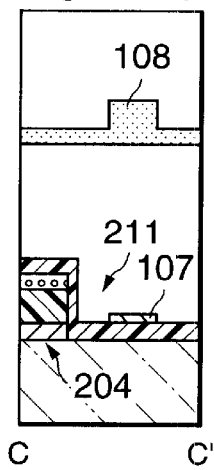   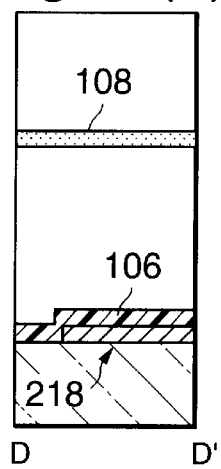

(SIXTH EMBODIMENT)

SP:SPUTTER
WE:WET ETCHING
DE:DRY ETCHING
CVD:CHEMICAL VAPOR DEPOSITION

Fig.33

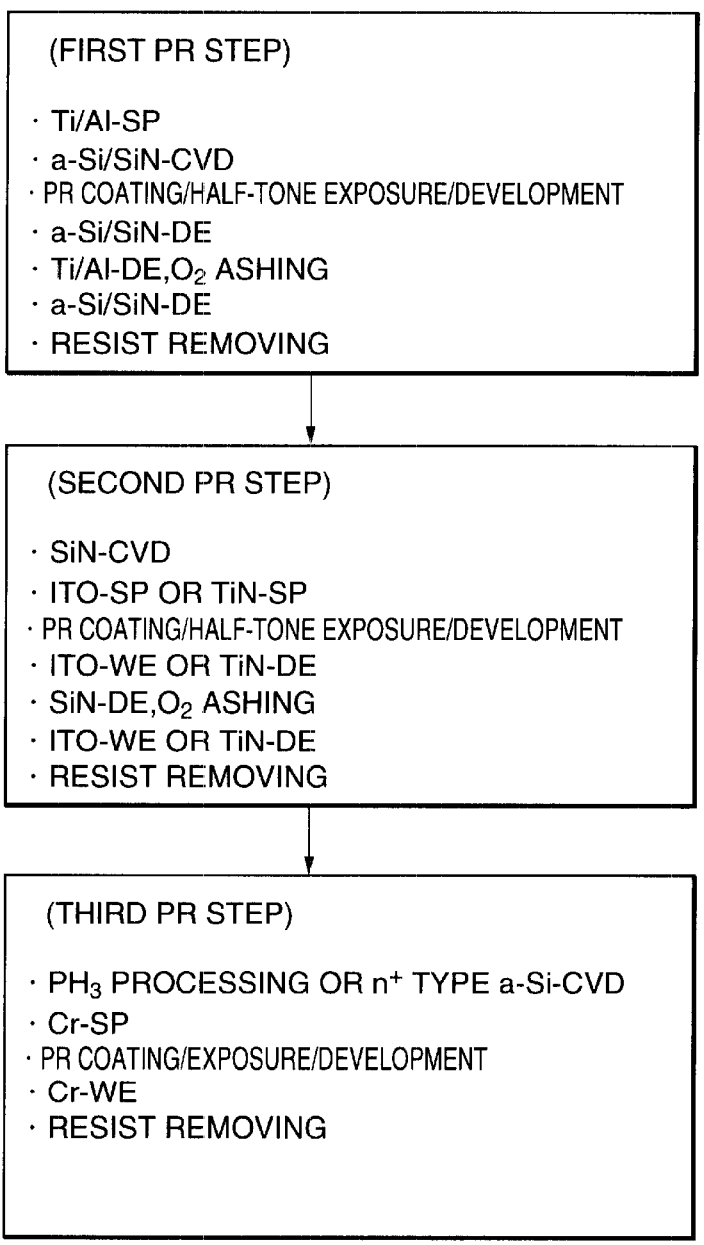

(SEVENTH EMBODIMENT)

(FIRST PR STEP)

- Ti/Al-SP
- a-Si/SiN-CVD
- PR COATING/HALF-TONE EXPOSURE/DEVELOPMENT
- a-Si/SiN-DE
- Ti/Al-DE,$O_2$ ASHING
- a-Si/SiN-DE
- RESIST REMOVING (SECOND PR STEP)

- SiN-CVD
- ITO-SP OR TiN-SP
- PR COATING/HALF-TONE EXPOSURE/DEVELOPMENT
- ITO-WE OR TiN-DE
- SiN-DE,$O_2$ ASHING
- ITO-WE OR TiN-DE
- RESIST REMOVING (THIRD PR STEP)

- $PH_3$ PROCESSING OR $n^+$ TYPE a-Si-CVD
- Cr-SP
- PR COATING/EXPOSURE/DEVELOPMENT
- Cr-WE
- RESIST REMOVING

SP:SPUTTER
WE:WET ETCHING
DE:DRY ETCHING
CVD:CHEMICAL VAPOR DEPOSITION

A　　　A'

B　　　B'

C　　　C'

D　　　D'

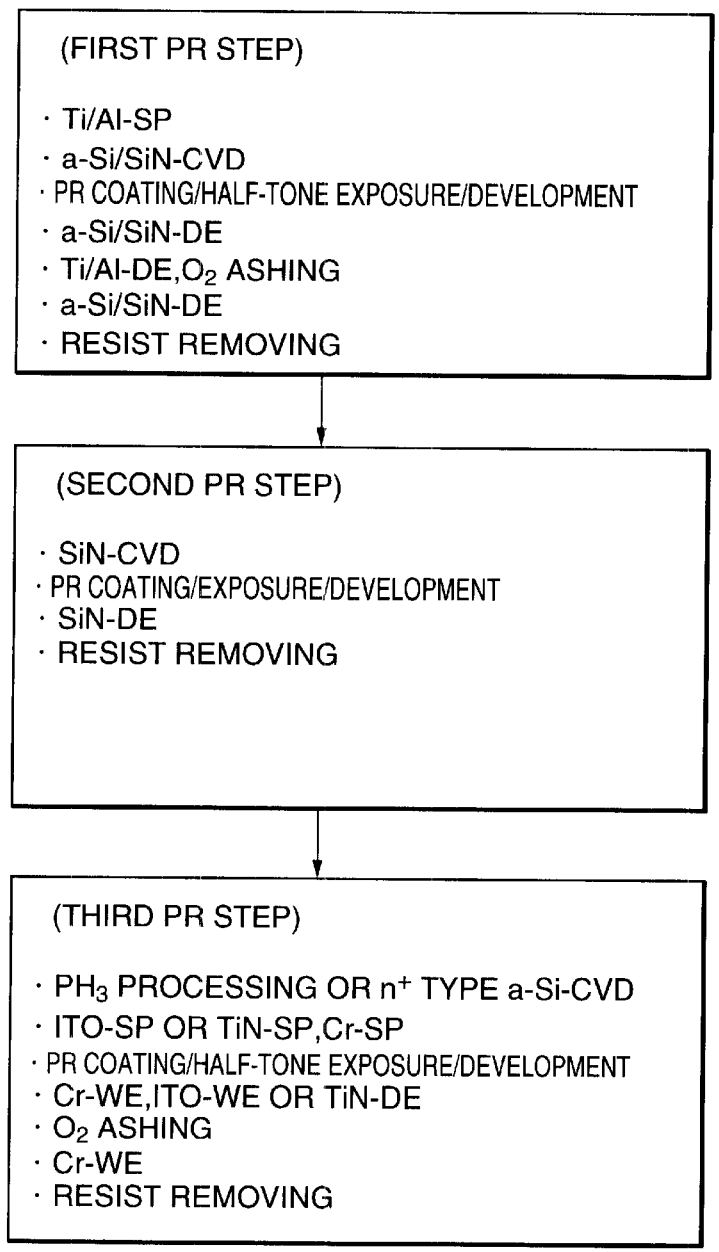

Fig.37

(EIGHTH EMBODIMENT)

(FIRST PR STEP)

- Ti/Al-SP
- a-Si/SiN-CVD
- PR COATING/HALF-TONE EXPOSURE/DEVELOPMENT
- a-Si/SiN-DE
- Ti/Al-DE, $O_2$ ASHING
- a-Si/SiN-DE
- RESIST REMOVING (SECOND PR STEP)

- SiN-CVD
- PR COATING/EXPOSURE/DEVELOPMENT
- SiN-DE
- RESIST REMOVING (THIRD PR STEP)

- $PH_3$ PROCESSING OR $n^+$ TYPE a-Si-CVD
- ITO-SP OR TiN-SP, Cr-SP
- PR COATING/HALF-TONE EXPOSURE/DEVELOPMENT
- Cr-WE, ITO-WE OR TiN-DE
- $O_2$ ASHING
- Cr-WE
- RESIST REMOVING

SP:SPUTTER
WE:WET ETCHING
DE:DRY ETCHING
CVD:CHEMICAL VAPOR DEPOSITION

Fig.38(a)
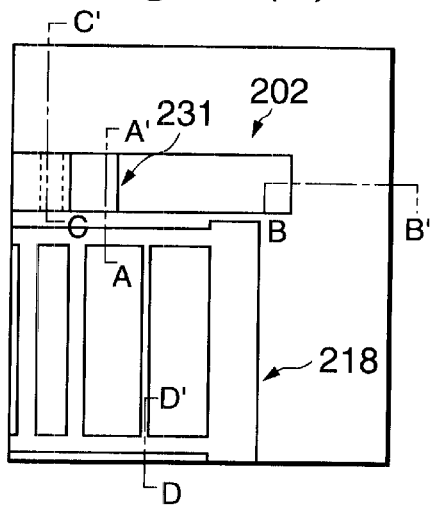
Fig.38(b) Fig.38(c)
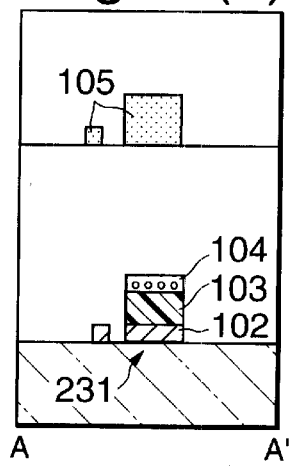 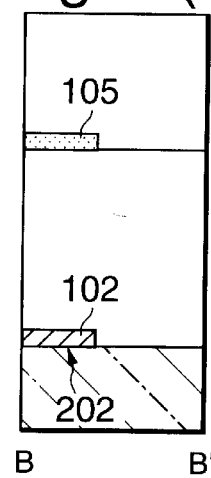
Fig.38(d) Fig.38(e)
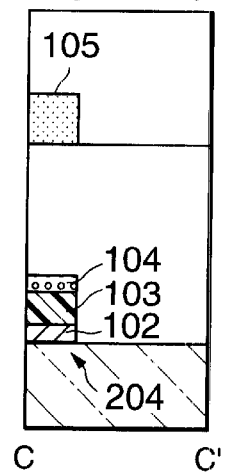 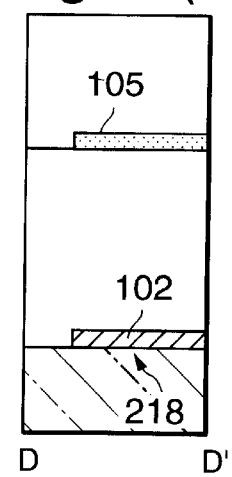

Fig.41

(NINTH EMBODIMENT)

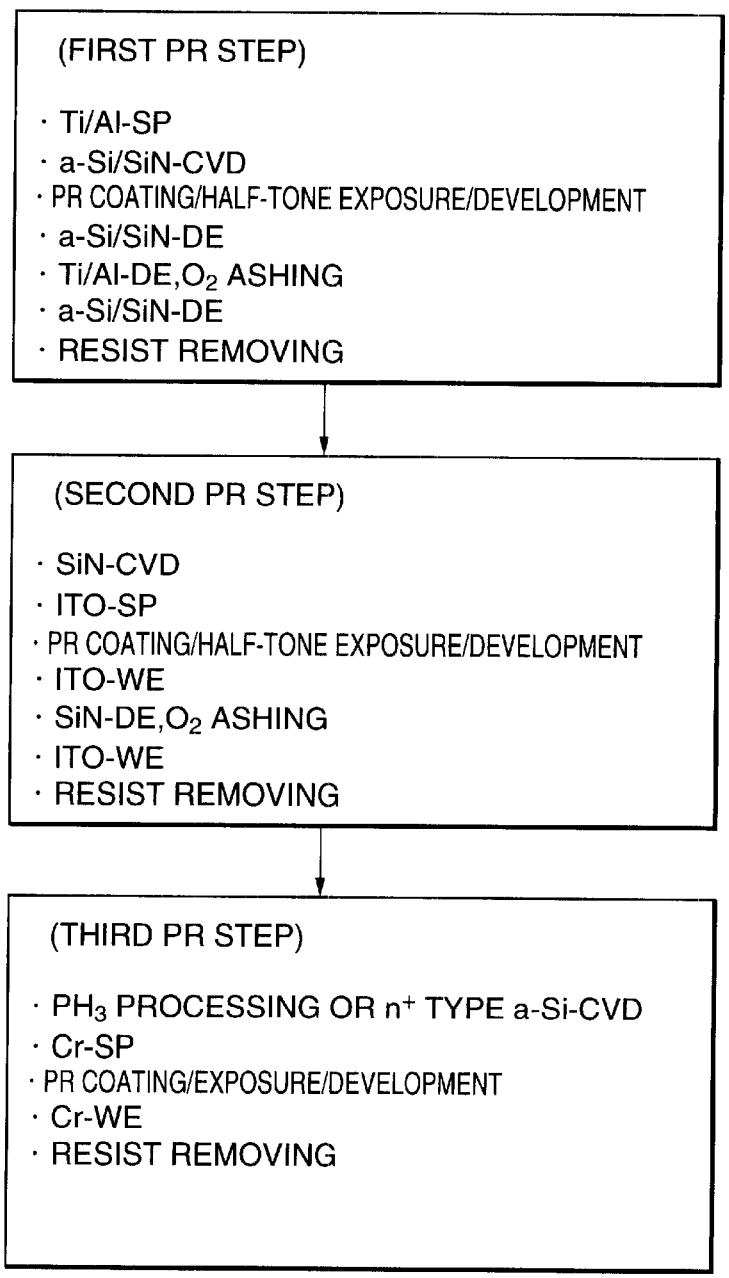

(FIRST PR STEP)

- Ti/Al-SP
- a-Si/SiN-CVD
- PR COATING/HALF-TONE EXPOSURE/DEVELOPMENT
- a-Si/SiN-DE
- Ti/Al-DE,$O_2$ ASHING
- a-Si/SiN-DE
- RESIST REMOVING (SECOND PR STEP)

- SiN-CVD
- ITO-SP
- PR COATING/HALF-TONE EXPOSURE/DEVELOPMENT
- ITO-WE
- SiN-DE,$O_2$ ASHING
- ITO-WE
- RESIST REMOVING (THIRD PR STEP)

- $PH_3$ PROCESSING OR $n^+$ TYPE a-Si-CVD
- Cr-SP
- PR COATING/EXPOSURE/DEVELOPMENT
- Cr-WE
- RESIST REMOVING

SP:SPUTTER
WE:WET ETCHING
DE:DRY ETCHING
CVD:CHEMICAL VAPOR DEPOSITION (TENTH EMBODIMENT)

SP:SPUTTER
WE:WET ETCHING
DE:DRY ETCHING
CVD:CHEMICAL VAPOR DEPOSITION

ACTIVE MATRIX SUBSTRATE AND MANUFACTURING METHOD THEREOF

BACKGROUND OF THE INVENTION

1. Field of the Invention

The present invention relates to an active matrix substrate for use in an active matrix type liquid crystal display using a thin film transistor (which will be abbreviated to TFT hereinafter) and to a manufacturing method thereof. More particularly, the present invention relates to reduction in production steps of a method for manufacturing an active matrix substrate.

2. Description of the Prior Art

An active matrix liquid crystal display using TFTs has an active matrix substrate on which pixel electrodes and TFTs for controlling a voltage applied to the pixel electrodes are arranged in the form of a matrix. The active matrix liquid crystal display has a structure that a liquid crystal is sandwiched between the active matrix substrate and an opposed substrate and the liquid crystal is driven by a voltage applied between the pixel electrode and the other electrode. In this case, there is a liquid crystal display adopting a vertical electric field system, in which the pixel electrode on the active matrix substrate is constituted by a transparent electrode and a voltage is applied between the pixel electrode and a transparent common electrode formed on the opposed substrate as the other electrode in order to drive the liquid crystal. Alternatively, there is a liquid crystal display adopting a horizontal electric field system, in which the pixel electrode on the active matrix substrate and the common electrode are constituted by a pair of comb-like electrodes and a voltage is applied between these electrodes to drive the liquid crystal. At any rate, the TFT and the pixel electrode must be finely formed on the active matrix substrate, and nowadays the TFT and the pixel electrode are formed by a photolithography technique.

FIG. 1 is a cross-sectional view showing a one-pixel area of a TFT and a pixel electrode having the prior art structure provided on an active matrix substrate. Here, a technique disclosed in Japanese Patent Application Laid-open No. 268353/1998 is illustrated. In manufacture of the TFT and the pixel electrode, the first metal thin film is formed on a transparent insulating substrate 300. In the first photolithography step (which will be abbreviated to a PR step hereinafter) using photoresist, the first metal thin film is patterned to form a gate electrode 301 and a gate bus line 302 connected to this gate electrode 301. Subsequently, the first insulating film 303 as a gate insulating film, an intrinsic amorphous silicon film (which will be referred to as an intrinsic a-Si film hereinafter) 304, and an ohmic contact film 305 consisting of the a-Si film in which impurities are introduced are sequentially superimposed on the insulating substrate 300.

The ohmic contact film 305 and the intrinsic a-Si film 304 are then patterned in the second PR step. Further, the second metal thin film is deposited, and the second metal thin film is patterned by the third PR step to form a drain electrode 306 connected to a drain bus line, and a source electrode 307.

Then, the second insulating film 308 is deposited on the entire surface. Further, by the fourth PR step, a pixel contact hole 309 and a drain bus line contact hole (not shown) which pierce the second insulating film 308 and reaches the surface of the source electrode 307 and the drain bus line respectively are opened through the second insulating film 308.

Furthermore, a gate bus line contact hole (not shown) which reaches even to the surface of the gate bus line is opened through the first insulating film 303 and the second insulating film 308. Moreover, a transparent electrode film, e.g., an ITO (INDIUM TIN OXIDE) film is deposited on the entire surface, and the transparent electrode film is patterned by the fifth PR step to form a pixel electrode 310 connected to the source electrode 307. In addition, although not illustrated in FIG. 1, a gate terminal portion connected to the gate bus line and a drain terminal portion connected to the drain bus line are simultaneously formed.

Such a prior art active matrix substrate requires five PR steps for forming the TFT, the pixel electrode, the gate terminal portion and the drain terminal portion. The five PR steps currently obstruct manufacturing the active matrix substrate at a low price, which is led by eliminating the cost required for the manufacturing steps. Thus, reduction in number of manufacturing steps, especially reduction in number of PR steps is examined. For example, Japanese Patent Application Laid-open No. 218925/1983 proposes a technique for reducing the PR steps to four steps by forming the pixel electrode, the gate electrode and the gate bus line by one PR step. Alternatively, a monthly publication FPD INTELLIGENCE 1999, pp. 31 to 35 or Japanese Patent Application Laid-open No. 2000-66240 discloses a technique for realizing patterning of films in different layers by one PR step by utilizing a half-tone exposure method to thereby reduce a number of the PR steps for the active matrix substrate.

In these improved techniques, the former technique has a process restriction that the gate electrode and the pixel electrode are formed by the same PR step and a structural restriction that the gate electrode and the pixel electrode are formed in the same layer. In particular, the structural restriction that the pixel electrode is formed in a lower layer must largely change the structure of the existing active matrix substrate. Additionally, in this structure, since the side surface of the intrinsic a-Si layer is not covered with a channel protection film but exposed, a liquid crystal layer exists through only a porous film such as a polyimide alignment layer when the liquid crystal display is configured. Further, there occurs a problem that impurities existing in the liquid crystal layer enter the intrinsic a-Si film by diffusion or an electric field to greatly deteriorate the characteristic of the TFT. In this regard, the latter technique has less structural and process restrictions and is particularly advantageous in that the pixel electrode can be manufactured as a layer structure similar to that of the existing active matrix substrate.

According to the latter technique utilizing the half-tone exposure method, as shown in schematic views illustrating a TFT portion of FIG. 2, a gate electrode 401 is first formed on an insulating substrate 400 and a gate insulating film 402, a intrinsic a-Si film 403, an ohmic a-Si film 404, and a metal film 405 are then sequentially superimposed thereon as shown in FIG. 2(a). Subsequently, a photoresist film 406 is coated thereon, and then exposed and developed to form a required pattern. At this time, a film thickness of the developed photoresist 406 becomes thinner in an area exposed by half-tone exposure, a part corresponding to a channel area of the TFT, than in a non-exposed area. Then, as shown in FIG. 2(b), the photoresist 406 is used as an etching mask to pattern the metal film 405, the ohmic a-Si film 404 and the intrinsic a-Si film 403 to form each island of the metal film 405, the ohmic a-Si film 404 and the intrinsic a-Si film 403. Thereafter, as shown in FIG. 2(c), when $O_2$ gas is used to perform ashing of the photoresist 406, the photoresist in the area subjected to half-tone exposure is removed and the metal film 405 is exposed in this area. Furthermore, as shown in FIG. 2(*d*), the metal film 405 is etched by using the photoresist 406 subjected to ashing to be formed as a source electrode and a drain electrode. Subsequently, the ohmic a-Si film 404 is etched to form a channel area. Then, by removing the photoresist 406, the TFT is completed as shown in FIG. 2(*e*).

As described above, according to the technique disclosed in the latter reference, among the manufacturing steps explained with reference to FIG. 1, the second PR step and the third PR step can be combined as one PR step in the manufacturing process. As a result, by using half-tone exposure, the active matrix substrate having the structure similar to the prior art structure can be manufactured by the four PR steps.

In this manner, although the five PR steps can be reduced to the four PR steps in the conventional manufacturing method, it is difficult to further reduce a number of the PR steps. Therefore, it is desired to further decrease a number of manufacturing steps of the active matrix substrate to reduce the cost.

SUMMARY OF THE INVENTION

It is an object of the present invention to solve the above-described drawbacks and provide an active matrix substrate for a liquid crystal display and a manufacturing method thereof which realize reduction in a number of manufacturing steps to three PR steps and also realize reduction in cost.

That is, the active matrix substrate according to the present invention has the following structure.

There is provided an active matrix substrate for a liquid crystal display, having a plurality of gate wirings and drain wirings orthogonal to each other formed on a transparent insulating substrate and a thin film transistor and a pixel electrode formed in an area surrounded by the gate wirings and the drain wirings, wherein the gate wiring on the active matrix substrate has a structure that a protection film covers a metal wiring, the thin film transistor is composed of a gate electrode formed of a metal wiring, a gate insulating film, a semiconductor film and a protection film in the mentioned order from the bottom, and the gate insulating film and the semiconductor film are formed into a plane shape equal to or smaller than the gate electrode.

The gate wiring of the active matrix substrate and the gate electrode, the gate insulating film and the semiconductor film of the thin film transistor are formed by patterning a laminated film that is obtained by sequentially depositing a metal film, a gate insulating film and the semiconductor film on the transparent insulating substrate. A resist mask is formed on the laminated film, the resist mask consisting of a thick resist portion having a large film thickness and a thin resist portion thinner than the thick resist portion. The laminated film is etched by using the resist mask as an etching mask to form a laminated film pattern consisting of the metal film, the gate insulating film and the semiconductor film in each of a gate wiring area and a thin film transistor area. The thin resist portion in the resist mask on the laminated film pattern is removed to expose the laminated film pattern under the thin resist portion. After removing the thin resist portion, the exposed laminated film pattern is etched by using the remaining thick resist portion as an etching mask. Only the metal film remains in the gate wiring area, and the laminated film consisting of the metal film, the gate insulating film and the semiconductor film remains in the thin film transistor area, thereby forming the active matrix substrate.

Further, according to the present invention, there is provided a method for manufacturing an active matrix substrate, comprising the steps of: forming a resist mask having a thin portion and a thick portion on a laminated film consisting of a plurality of films; patterning the laminated film by using the resist mask as a mask; removing the thin portion of the resist mask to expose the laminated film in the removed portion; etching the exposed laminated film by using remaining portion in the thick portion of the resist mask as a mask; and etching an upper layer film of the laminated film to leave a lower layer film.

Specifically, the method adopts the basic structure comprising: a step of forming the first laminated film having a plurality of films laminated on a transparent insulating substrate; a step of forming the first resist mask consisting of the first thick resist portion with a large film thickness and the first thin resist portion having a smaller film thickness than the first thick resist portion on the first laminated film; a step of etching the first laminated film by using the first resist mask as a mask to form the first pattern consisting of the first laminated film; a step of etching the first resist mask to remove the first thin resist portion so that the first thick resist portion remains as the first remaining resist mask on the first pattern, and exposing a part of the first pattern; and a step of etching an exposed portion of the first pattern by using the first remaining resist mask as a mask to remove at least an uppermost layer film constituting the first pattern so that the second pattern consisting of films of the first laminated film excluding the upper most layer film is formed.

BRIEF DESCRIPTION OF THE DRAWINGS

FIG. 4 is a manufacture flowchart of the first embodiment according to the present invention;

FIGS. 6(*a*) to (*f*) are a plane view and cross-sectional views showing a manufacture step continued from FIGS. 5;

FIGS. 8(*a*) to (*f*) are a plane view and cross-sectional views showing a manufacture step continued from FIGS. 7;

FIGS. 10(*a*) to (*f*) are a plane view and cross-sectional views showing a manufacture step continued from FIGS. 9;

FIGS. 11(*a*) to (*f*) are a plane view and cross-sectional views showing a manufacture step continued from FIGS. 10;

FIG. 13 is a manufacture flowchart of the second embodiment according to the present invention;

FIG. 17 is a manufacture flowchart of the third embodiment according to the present invention;

FIG. 21 is a manufacture flowchart of the fourth embodiment according to the present invention;

FIGS. 27(a) to (e) are a plane view and cross-sectional views showing a manufacture step continued from FIGS. 26;

FIG. 33 is a manufacture flowchart of the seventh embodiment according to the present invention;

FIG. 37 is a manufacture flowchart of the eighth embodiment according to the present invention;

FIGS. 38(a) to (e) are a plane view and cross-sectional views of the first PR step of the eighth embodiment according to the present invention;

FIG. 41 is a manufacture flowchart of the ninth embodiment according to the present invention;

DETAILED DESCRIPTION OF THE PREFERRED EMBODIMENTS

Figure 1:
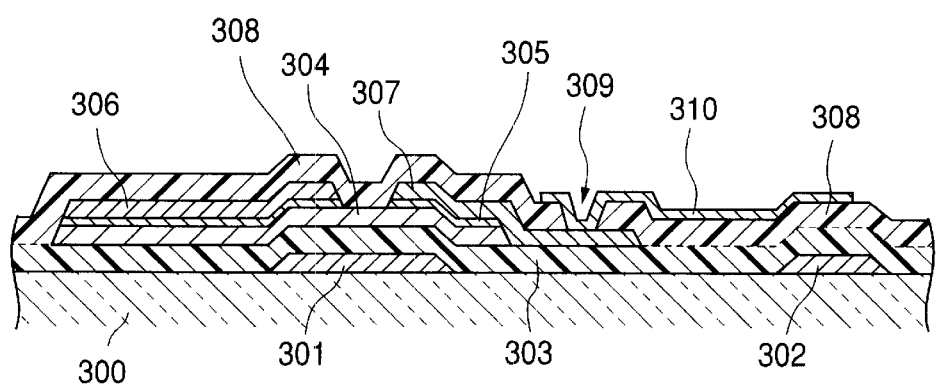
FIG. 1 is a cross-sectional view showing a conventional TFT.
Figure 2A:
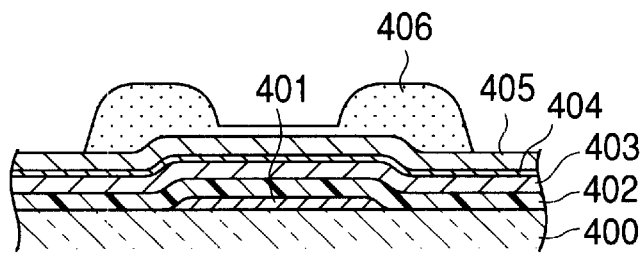
FIGS. 2(*a*) to (*e*) are cross-sectional views for explaining a method for manufacturing the conventional TFT.
Figure 2B:
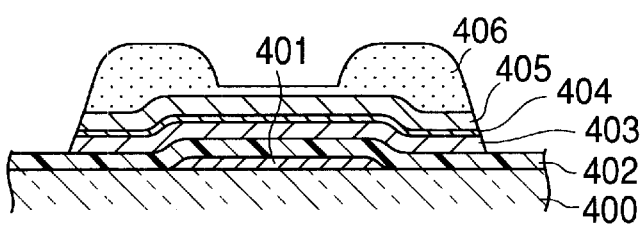
Figure 2C:
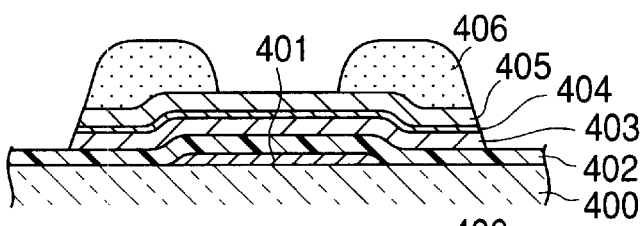
Figure 2D:
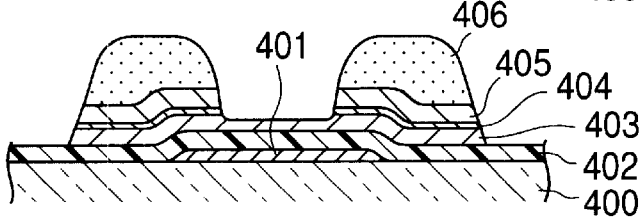
Figure 2E:
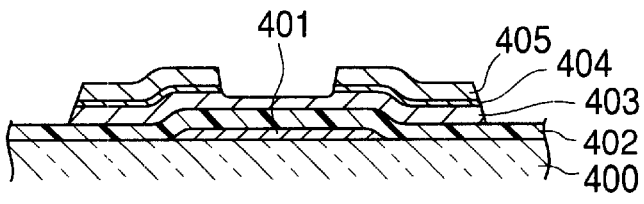
Figure 3:
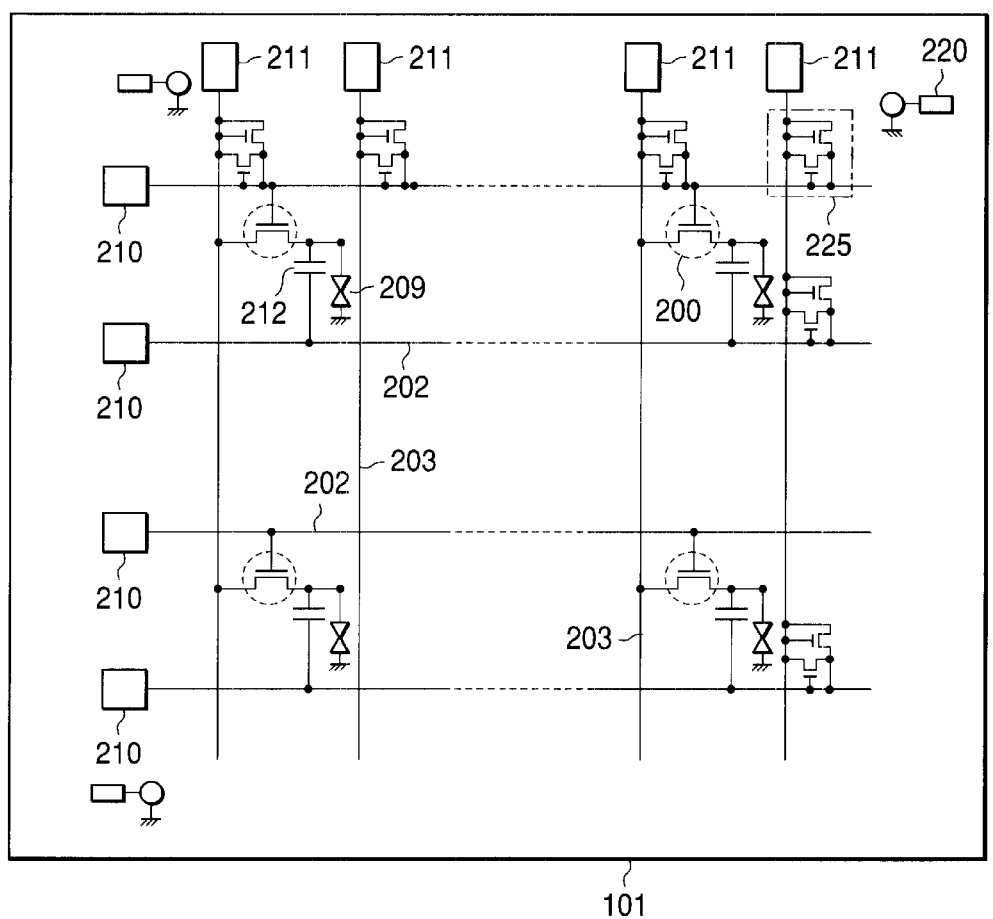
FIG. 3 is a circuit diagram of a TFT used in the present invention.
Figure 5A:
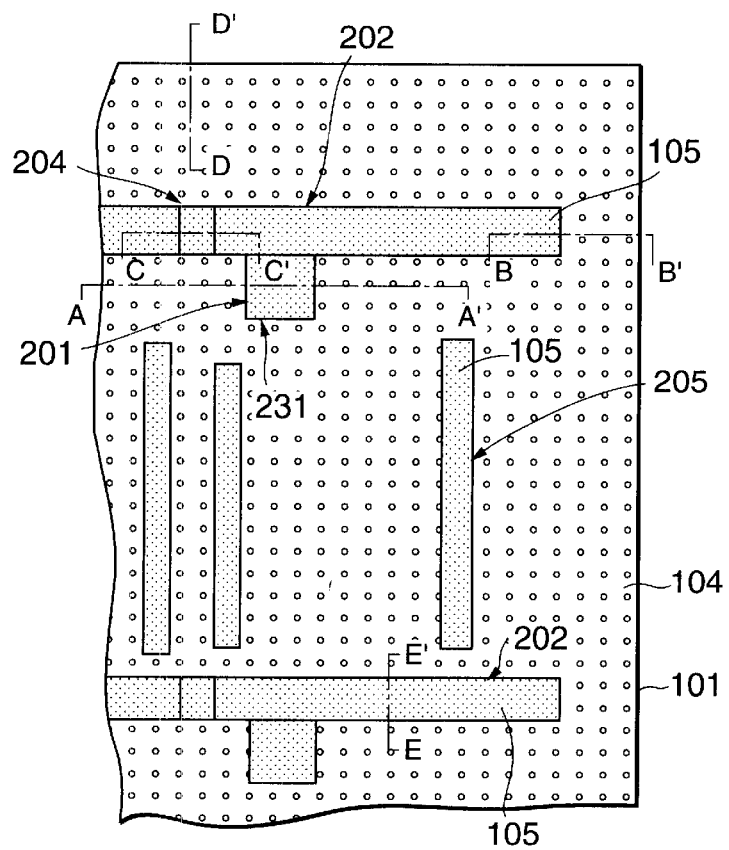
FIGS. 5(*a*) to (*f*) are a plane view and cross-sectional views showing the first PR step of the first embodiment according to the present invention.
Figure 5B:
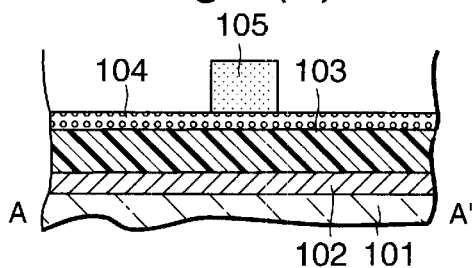
Figure 5C:
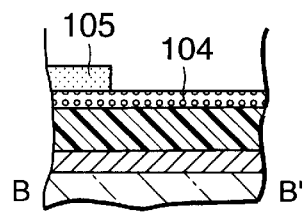
Figure 5D:
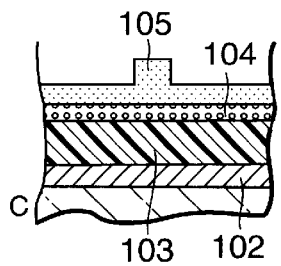
Figure 5E:
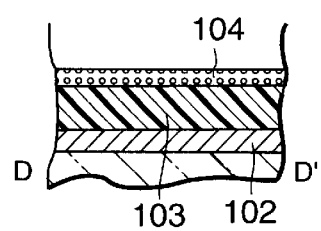
Figure 5F:
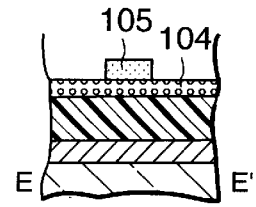

FIG. 3 is an equivalent circuit diagram showing an active matrix substrate adopting a vertical electric field system, and the active matrix substrate is constituted by a plurality of gate bus lines 202 and drain bus lines 203 extending in parallel in directions orthogonal to each other at specified intervals, a pixel electrode 209 formed in an area surrounded by these bus liens, and a TFT 200 formed in an area in the vicinity of an intersection of the gate bus line 202 and the drain bus line 203. Here, the pixel electrode 209 is connected to a source electrode of the TFT 200, and the pixel electrode 209 and the adjacent gate bus line 202 constitute a storage capacity 212. Further, one end portion of the gate bus line 202 is configured as a gate terminal portion 210 to which a scanning signal is inputted, and one end portion of the drain bus line 203 is configured as a drain terminal portion 211 to which a data signal is inputted. Each of these portions is arranged along the side edge portion of a transparent insulating substrate 101 and a tape-shaped wiring connected to a non-illustrated driver is connected to such a portion. It is to be noted that reference numeral 225 denotes a protection element and 220 designates a common terminal portion in the drawing. FIG. 4 is a flowchart showing a manufacturing method of the first embodiment in which the present invention is applied to a vertical electric field type liquid crystal display, and an active matrix substrate is manufactured by three PR steps by using half-tone exposure according to this method.

For an explanation of the three PR steps referring to the equivalent circuit shown in FIG. 3, half-tone exposure is used to form the gate bus line 202 and the TFT 200 constituted by gate islands including, the gate electrode and a intrinsic a-Si film on the gate electrode in the first PR step. In the second PR step, half-tone exposure is used to form the pixel electrode 209, the gate terminal portion 210, the drain terminal portion 211, a source opening portion and a drain opening portion, both of which are opened in a non-illustrated channel protection film. Thereafter, in the third PR step, the drain bus line 203, a non-illustrated drain electrode, a source electrode, a gate terminal contact portion, and a drain terminal contact portion are formed.

The first embodiment will now be described with reference to a flowchart of FIG. 4 and FIGS. 5 to 12. Incidentally, in each of FIGS. 5 to 12, (a) is a plane view showing a one-pixel corresponding area of the active matrix substrate and conveniently showing an area including each terminal portion provided to an end portion of the active matrix substrate; (b), a cross-sectional view of a gate island portion taken along the line AA' in FIG. (a); (c) is a cross-sectional view of a gate terminal portion taken along the line BB' in FIG. (a); (d), a cross-sectional view of a gate/drain intersection portion taken along the line CC' in FIG. (a); (e), a cross-sectional view of a drain terminal portion taken along the line DD' in FIG. (a); and (f), a cross-sectional view of a gate storage portion taken along the line EE' in FIG. (a).

As shown in FIG. 5, a Ti/Al film 102 obtained by laminating Ti and Al is formed with a thickness of 0.1 to 0.3 μm on a transparent insulating substrate 101 of, e.g., glass by a sputtering method. A SiN film 103 with a thickness of 0.3 to 0.5 μm is formed as a gate insulating film on the Ti/Al film 102 and an intrinsic a-Si film 104 is further formed thereon with a thickness of 0.05 to 0.2 μm by a plasma CVD method, respectively. The first photoresist 105 is coated on the intrinsic a-Si film 104.

The film 102 is not restricted to Ti/Al, and Cr, Mo and others can be used.

Subsequently, a non-illustrated first photomask is used with respect to the first resist 105 to perform half-tone exposure. The first photomask used in this half-tone exposure is formed as a full-mask portion for substantially completely shielding the light to an area corresponding to the gate electrode 201 and the island 231, both constituting the TFT, and an area corresponding to the gate/drain intersection portion 204 which a part of the gate bus line 202 constituted as the gate wiring and the later-described drain bus line 203 cross to each other. However, any other portion of the gate bus line 202 and a portion corresponding to a light shielding portion 205 are configured as a half-tone portion. The half-tone portion has a structure that fine light shielding patterns are arranged at appropriate intervals or are composed of a material with a low optical transmittance although not shown. Therefore, when positive type photoresist is used for the photoresist, exposure with a very small quantity of light is carried out with respect to the photoresist in the half-tone portion. When this photoresist is developed, a film thickness of the photoresist in an area corresponding to the half-tone portion becomes thinner than a film thickness of the full-mask portion. Accordingly, the first photoresist 105 subjected to the half-tone exposure using the first photomask and development has a cross-sectional structure in which an area with a large film thickness subjected to exposure in the full-mask portion and an area with a small film thickness subjected to exposure in the half-tone portion are mixed as shown in FIG. 5. Furthermore, by sequentially dry-etching the intrinsic a-Si film 104, the SiN film 103, and the Ti/Al film 102 by using this first photoresist 105, the gate electrode 201, the island 231, the gate bus line 202 and the light shielding portion 205 are patterned in each shape as shown in FIG. 6.

Figure 7A:
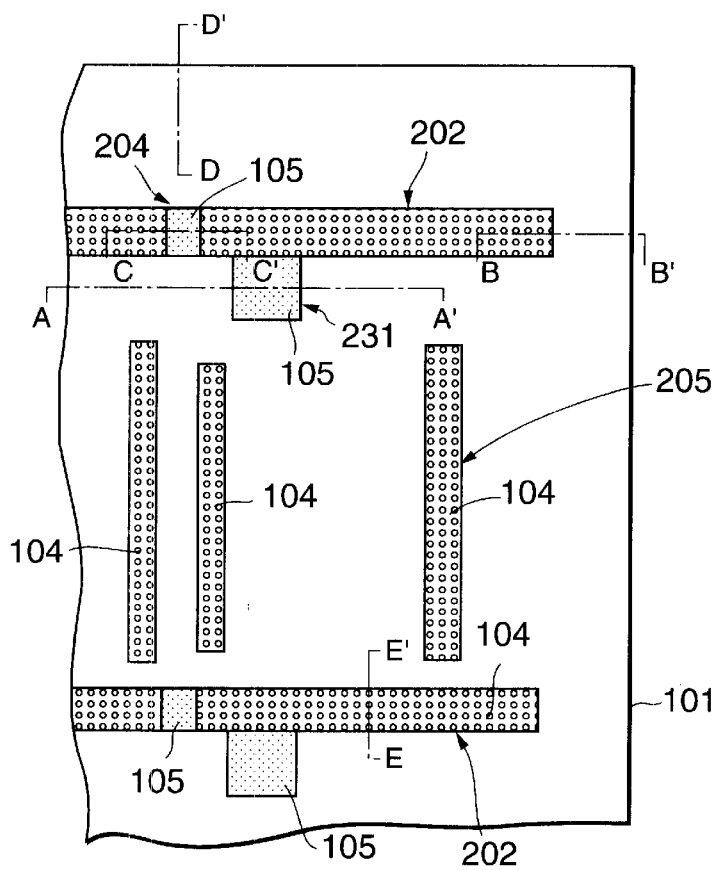
FIGS. 7(*a*) to (*f*) are a plane view and cross-sectional views showing a manufacture step continued from FIGS. 6.
Figures 7B, 7C:
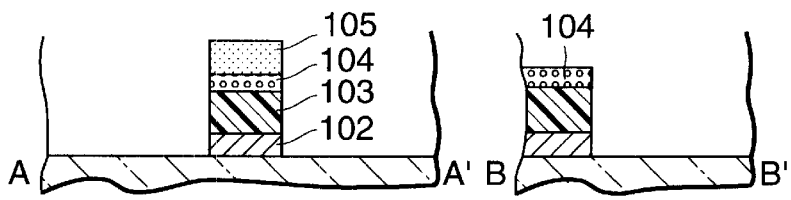
Figures 7D, 7E, 7F:
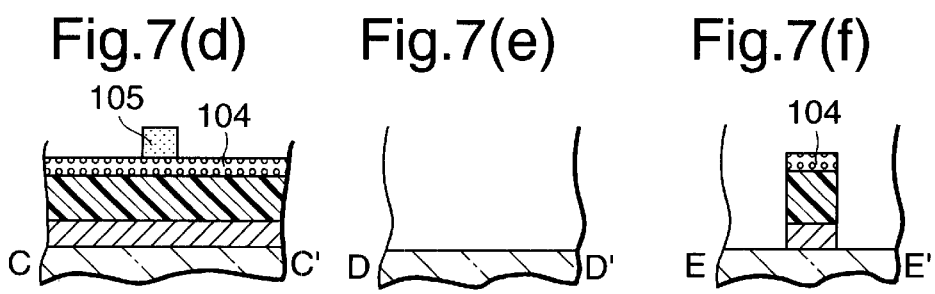

Thereafter, when the first photoresist 105 is subjected to $O_2$ ashing and the film thickness is reduced from the surface side, the first photoresist 105 is completely removed in the thinly formed half-tone portion corresponding to the gate bus line 202 and the light shielding portion 205 as shown in FIGS. 7(c) and (f), thereby exposing the underlying intrinsic a-Si film 104.

Moreover, although the thickly formed portion of the first photoresist 105 is thinned, it still remains as a mask on the intrinsic a-Si film 104 as shown in FIGS. 7(b) and (d). Subsequently, by dry-etching the intrinsic a-Si film 104 and the SiN film (gate insulating film) 103 by using the remaining first photoresist 105, the intrinsic a-Si film 104 and the SiN film 103 on the gate bus line 202 are selectively etched as shown in FIG. 8, and the gate bus line 202 is formed by the Ti/Al film 102 which remains without being etched. At this time, in an area covered with the first photoresist 105, the SiN film 103 and the intrinsic a-Si film 104 remain on the Ti/Al film 102 without being etched. Further, the gate electrode 201 and the island 231 made by lamination of these films, and the gate/drain intersection portion 204 in an area crossing the later-described drain bus line 203 on the gate bus line 202 are formed. It is to be noted that the first photoresist 105 is then removed. Consequently, the gate electrode 201, the island 231, the gate bus line 202, the gate/drain intersection portion 204 and the light shielding portion 205 are formed by the first PR step.

Figure 9A:
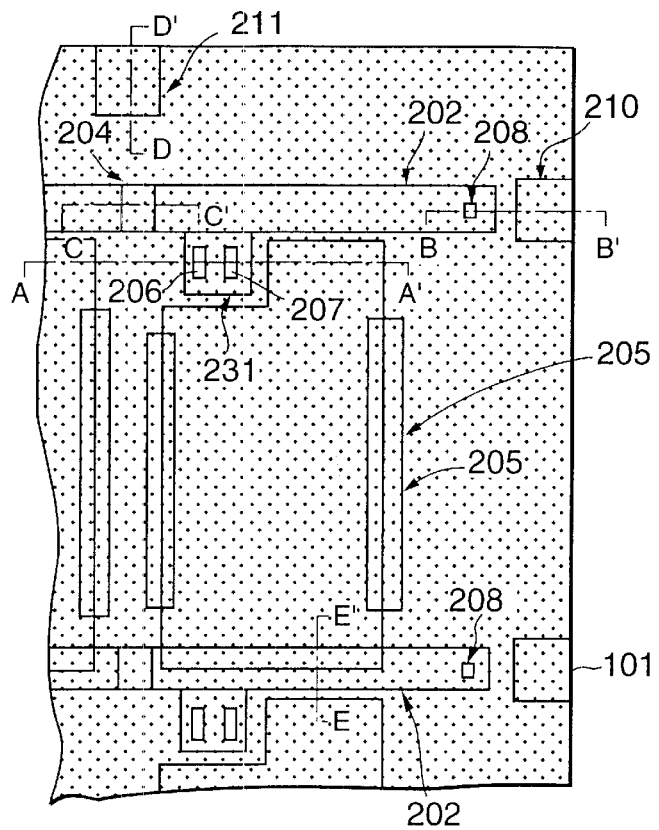
FIGS. 9(*a*) to (*f*) are a plane view and cross-sectional views showing a manufacture step continued from FIGS. 8.
Figures 9B, 9C:
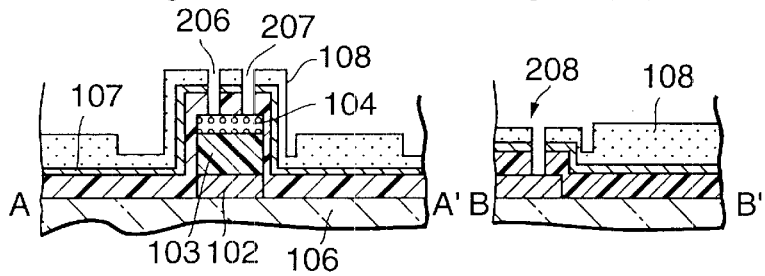
Figures 9D, 9E, 9F:
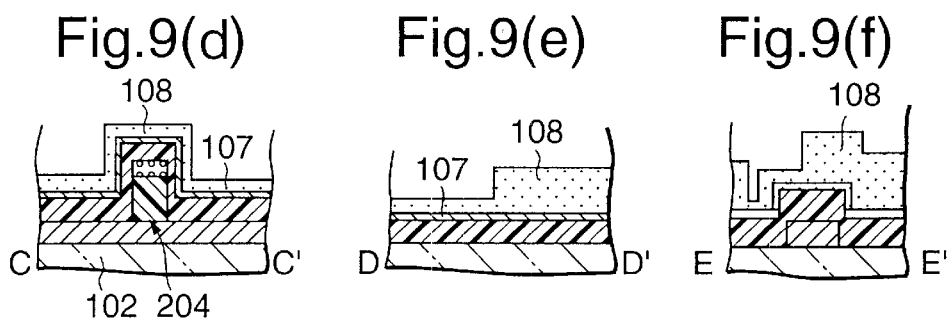
Figure 12A:
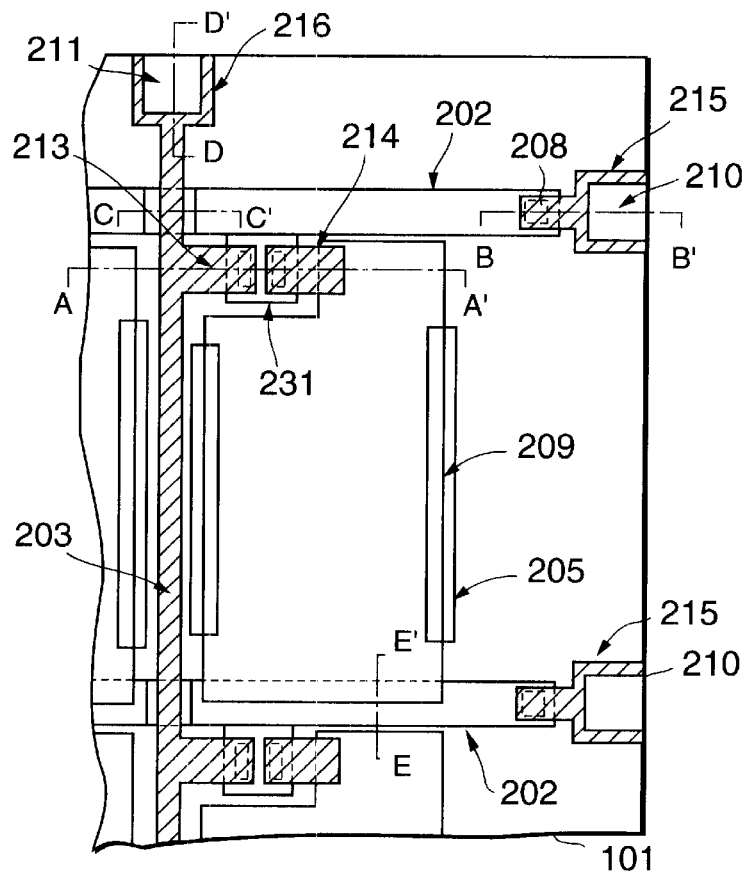
FIGS. 12(*a*) to (*f*) are a plane view and cross-sectional views showing a manufacture step continued from FIGS. 11.
Figure 12B:
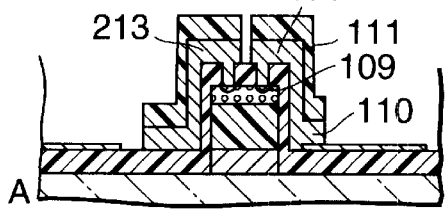
Figure 12C:
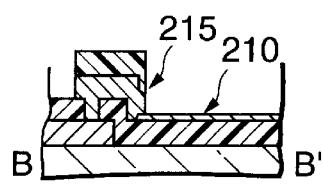
Figure 12D:
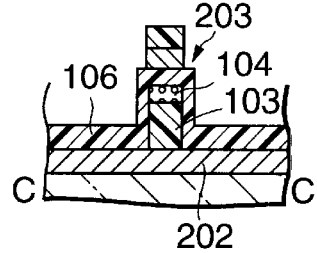
Figure 12E:
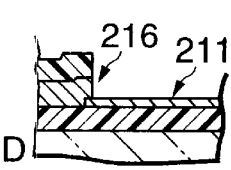
Figure 12F:
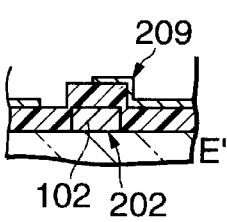
Figure 14A:
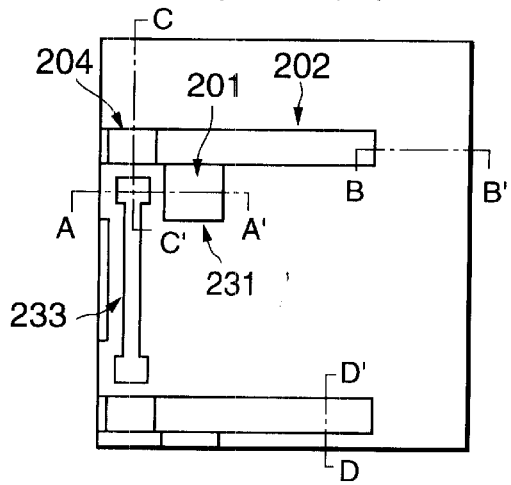
FIGS. 14(*a*) to (*e*) are a plane view and cross-sectional views showing the first PR step of the second embodiment according to the present invention.
Figure 14B:
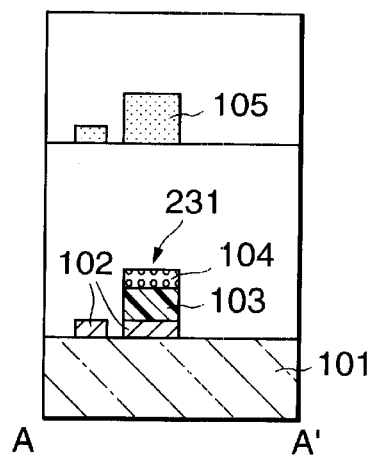
Figure 14C:
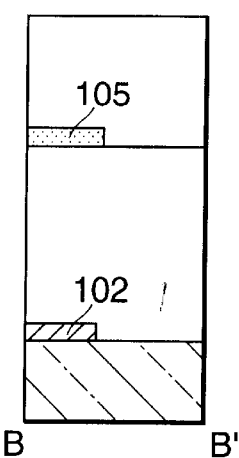
Figure 14D:
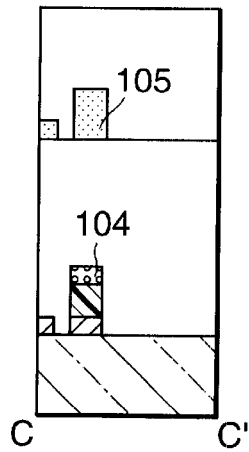
Figure 14E:
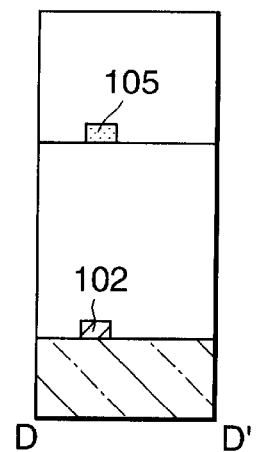
Figure 15A:
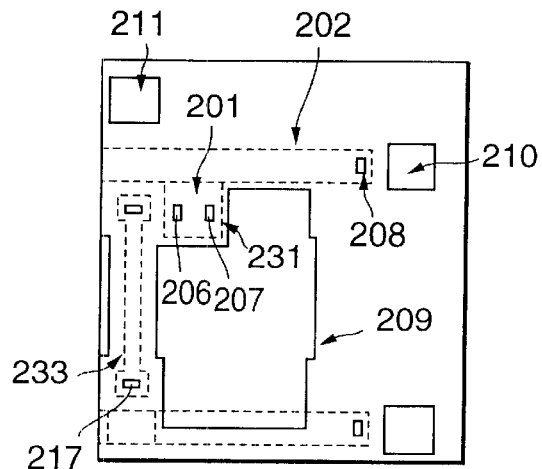
FIGS. 15(a) to (e) are a plane view and cross-sectional views showing a manufacture step continued from FIGS. 14.
Figure 15B:
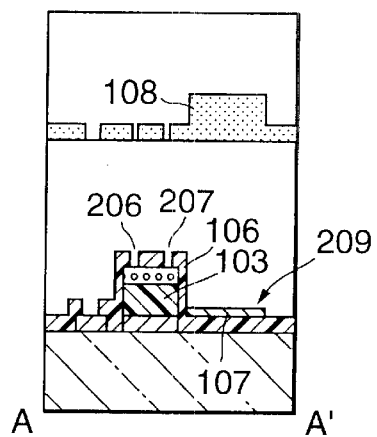
Figure 15C:
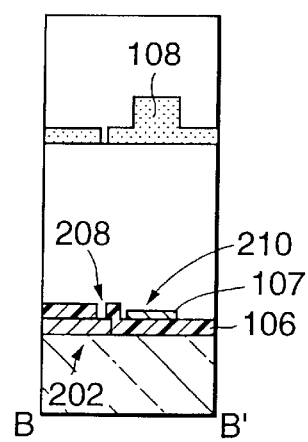
Figure 15D:
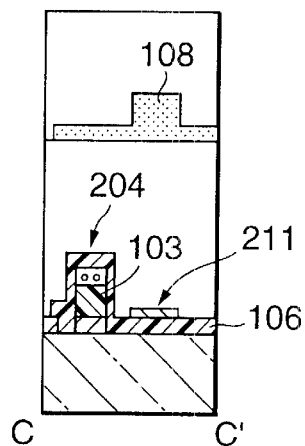
Figure 15E:
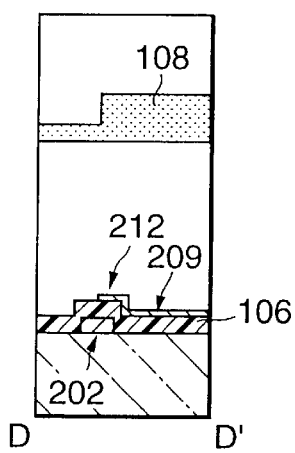
Figure 16A:
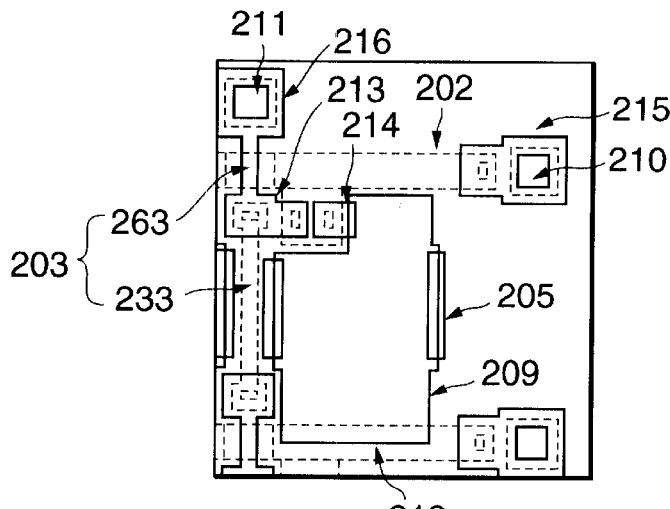
FIGS. 16(a) to (e) are a plane view and cross-sectional views showing a manufacture step continued from FIGS. 15.
Figure 16B:
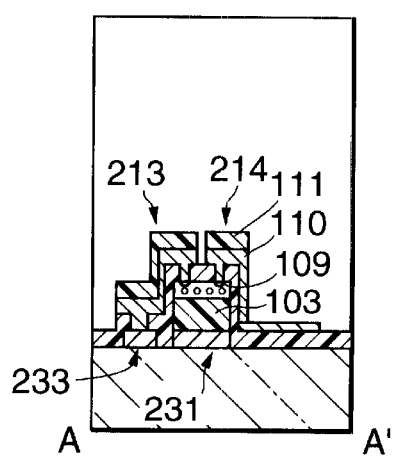
Figure 16C:
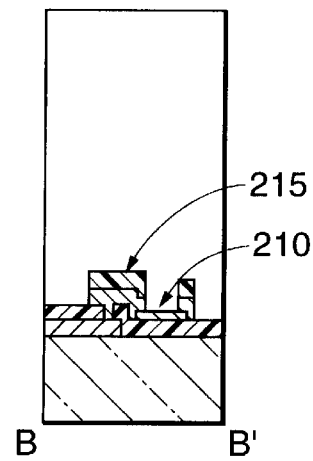
Figure 16D:
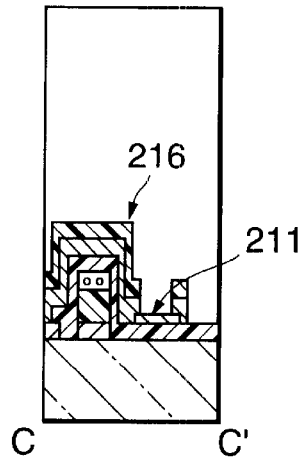
Figure 16E:
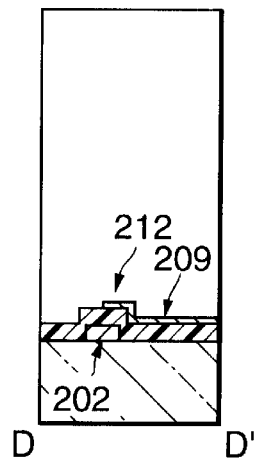
Figure 18A:
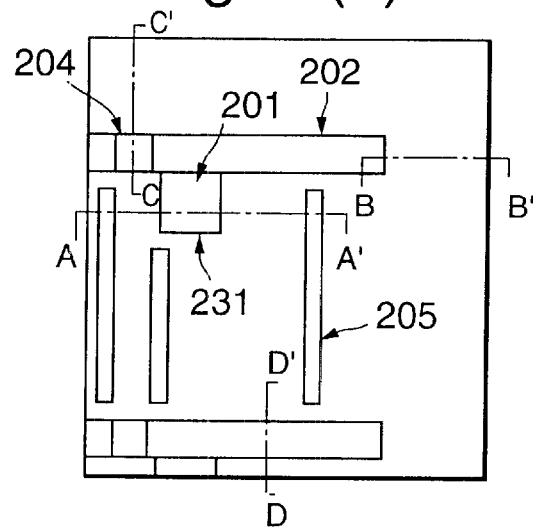
FIGS. 18(a) to (e) are a plane view and cross-sectional views showing a manufacture step continued from FIG. 17.
Figure 18B:
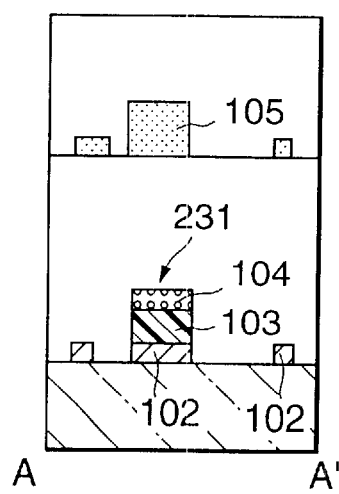
Figure 18C:
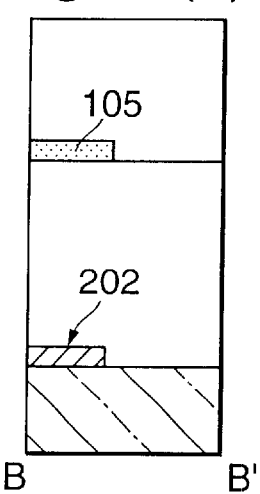
Figure 18D:
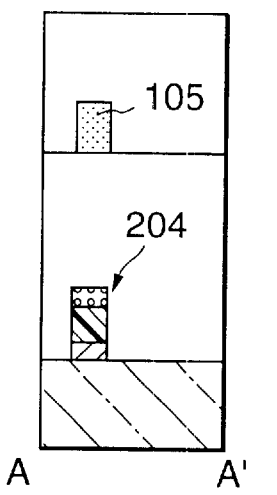
Figure 18E:
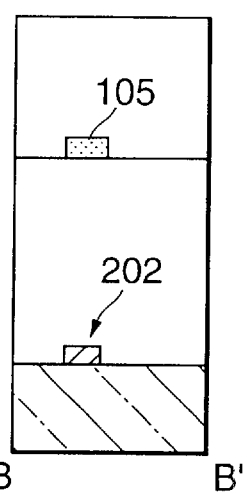
Figure 19A:
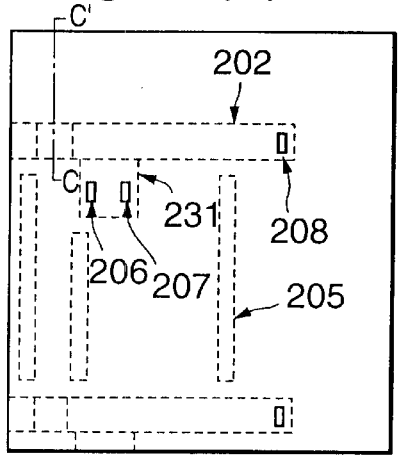
FIG. 19(a) to (e) are a plane view and cross-sectional views showing a manufacture step continued from FIGS. 18.
Figure 19B:
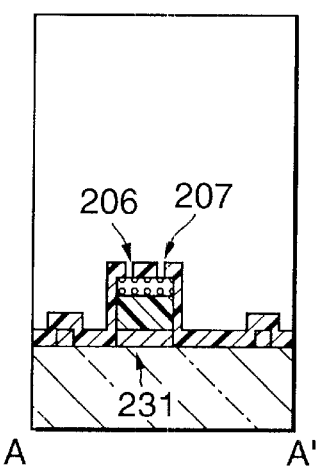
Figure 19C:
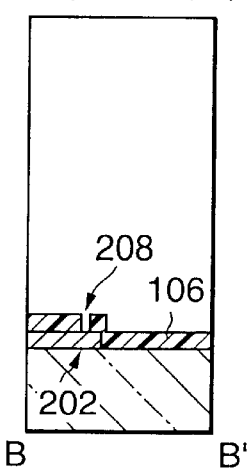
Figure 19D:
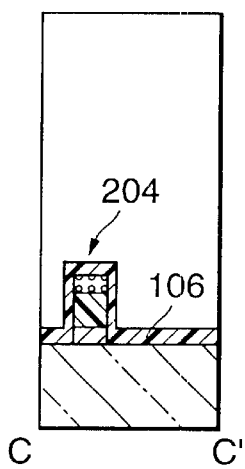
Figure 19E:
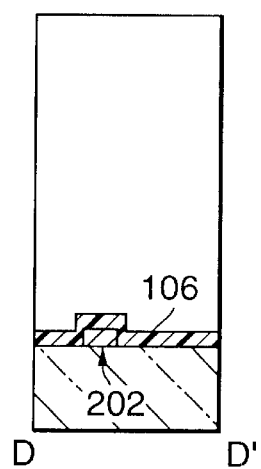
Figure 20A:
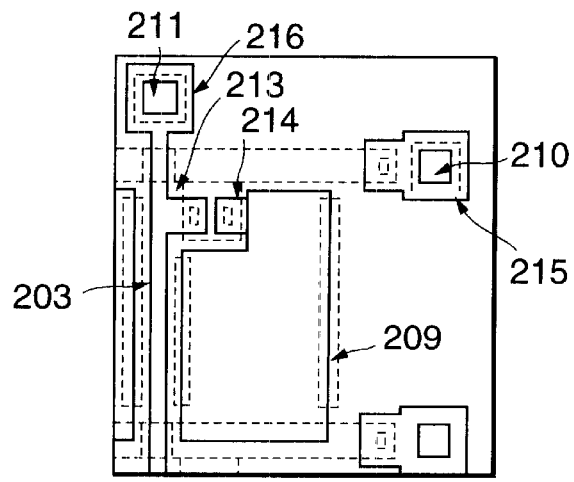
FIGS. 20(a) to (e) are a plane view and cross-sectional views showing a manufacture step continued from FIGS. 19.
Figure 20B:
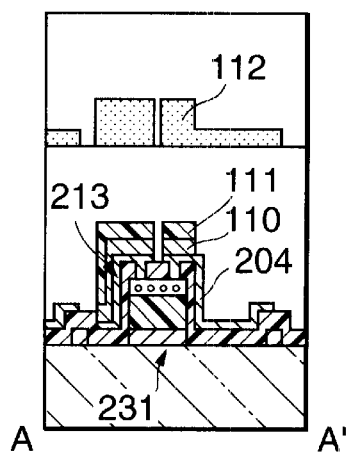
Figure 20C:
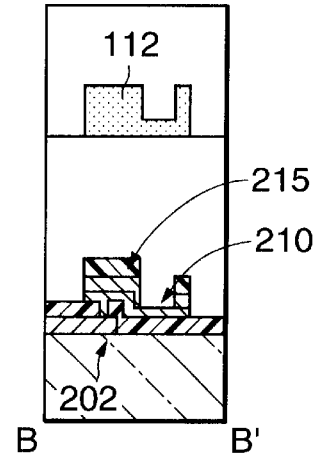
Figure 20D:
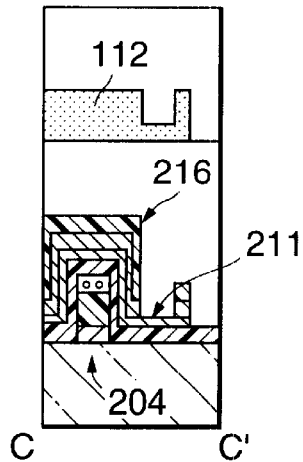
Figure 20E:
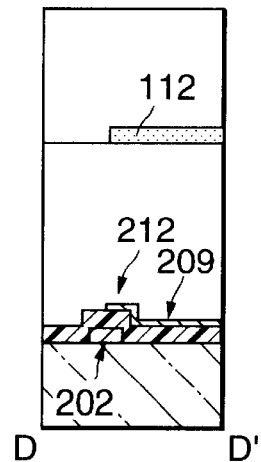
Figure 22A:
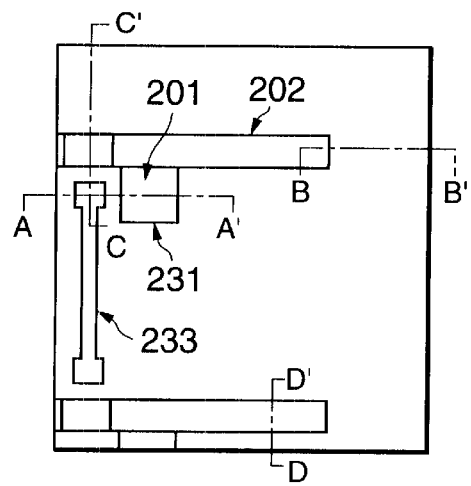
FIGS. 22(a) to (e) are a plane view and cross-sectional views showing the first PR step of the fourth embodiment according to the present invention.
Figure 22B:
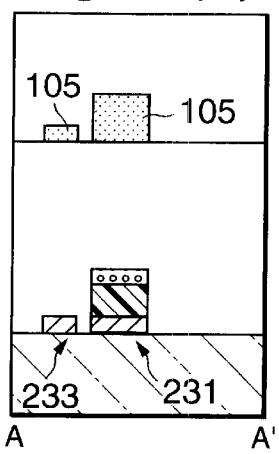
Figure 22C:
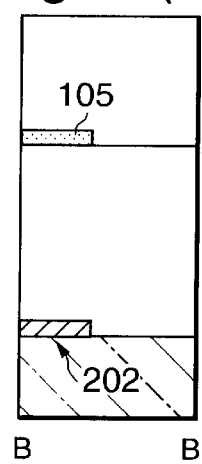
Figure 22D:
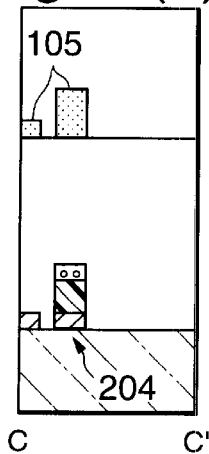
Figure 22E:
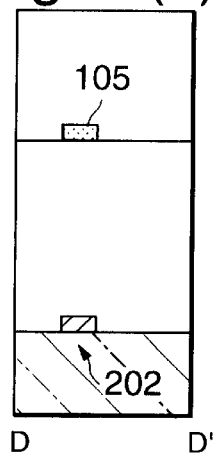
Figure 23A:
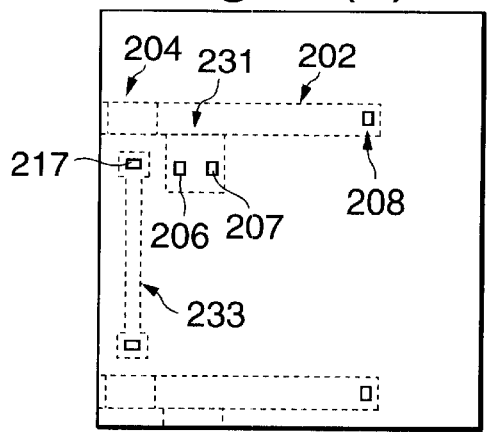
FIGS. 23(a) to (e) are a plane view and cross-sectional views showing a manufacture step continued from FIGS. 22.
Figure 23B:
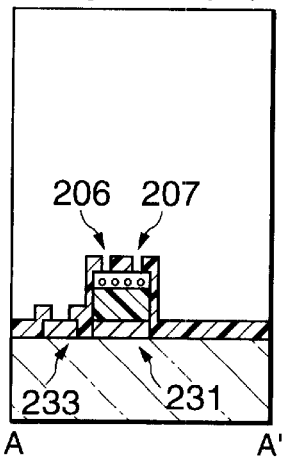
Figure 23C:
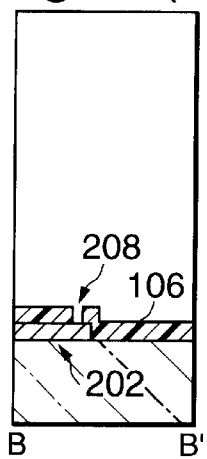
Figure 23D:
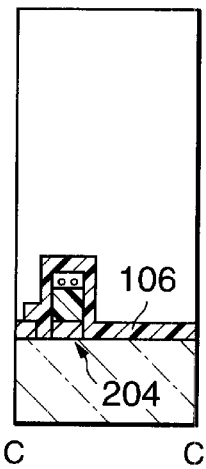
Figure 23E:
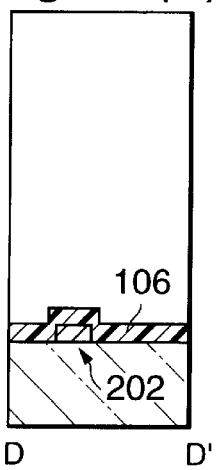
Figure 24A:
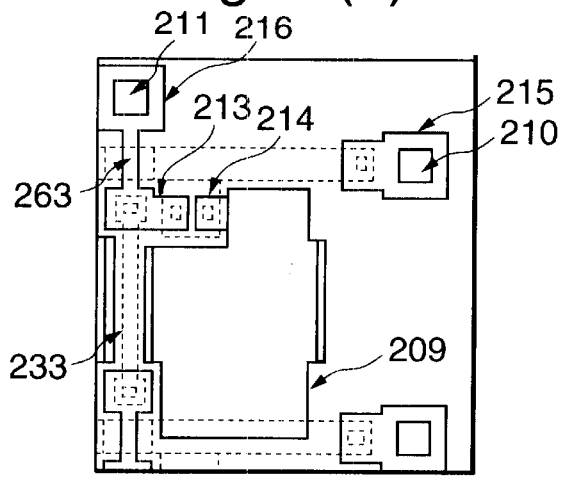
FIGS. 24(a) to (e) are a plane view and cross-sectional views showing a manufacture step continued from FIGS. 23.
Figure 24B:
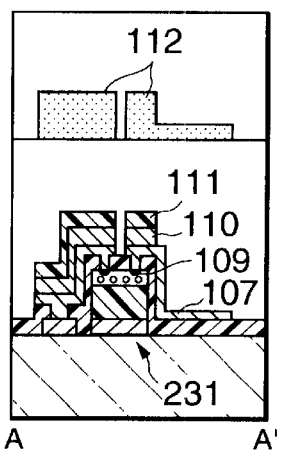
Figure 24C:
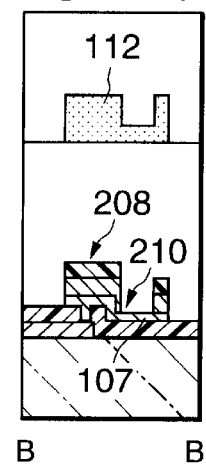
Figure 24D:
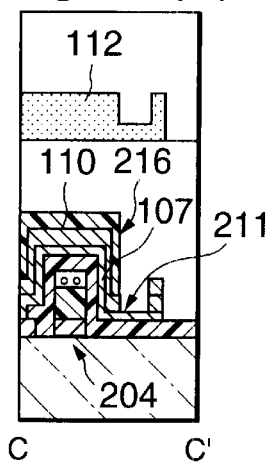
Figure 24E:
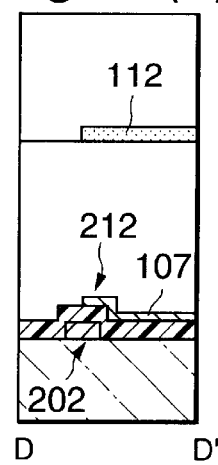

Thereafter, as shown in FIG. 9, the SiN film 106 which serves as a channel protection film is deposited on the entire surface with a thickness of 0.1 to 0.4 μm by the plasma CVD method. In addition, an ITO film 107 which is a transparent electrode material is deposited thereon with a thickness of 30 to 100 nm by the sputtering method. Additionally, second photoresist 108 is coated on the ITO film 107.

Subsequently, a non-illustrated second photomask is used with respect to the second photoresist 108 to carry out the half-tone exposure. The second photomask used in the half-tone exposure is a mask pattern having a pattern shape corresponding to a later-described drain opening portion 206, a source opening portion 207, and a gate bus line contact hole 208, and areas other than the pixel electrode 209, the gate terminal portion 210 and the drain terminal portion 211 are constituted as the half-tone portion.

Therefore, as shown in FIG. 9, after the second photoresist 108 is exposed by using the second photomask and then developed, the second photoresist 108 is used to wet-etch the ITO film 107, and each ITO film 107 in areas of the drain opening portion 206, the source opening portion 207, the gate bus line contact hole 208 is removed by etching. Further, the underlying SiN film (channel protection film) 106 is dry-etched so that the intrinsic a-Si film 104 is exposed in the drain opening portion 206 and the source opening portion 207 and the Ti/Al film 102 of the gate bus line 202 is exposed in the gate bus line contact hole 208, respectively. Thereafter, when the second photoresist 108 is subjected to $O_2$ ashing to reduce the film thickness from the surface side, the second photoresist 108 is completely removed in the thinly formed half-tone portion in the areas other than the pixel electrode 209, the gate terminal portion 210 and the drain terminal portion 211 and the underlying ITO film 107 is exposed as shown in FIG. 10.

Subsequently, when the second photoresist 108 is again used to wet-etch the ITO film 107, the pixel electrode 209, the gate terminal portion 210 and the drain terminal portion 211 are formed by the ITO film 107 which remains without being etched in the area covered with the second photoresist 108. The second photoresist 108 is then removed. As a result, the drain opening portion 206, the source opening portion 207, the gate bus line contact hole 208, the pixel electrode 209, the gate terminal portion 210 and the drain terminal portion 211 are respectively formed by the second PR step. It is to be noted that a part of the pixel electrode 209 and a part of the gate bus line 202 of an adjacent pixel sandwiches the channel protection film 106 therebetween and a gate storage portion 212 is simultaneously formed.

Then, as shown in FIG. 11, the surface of the intrinsic a-Si film 104 exposed through the drain opening portion 206 and the source opening portion 207 is subjected to $PH_3$ processing to form an $n^+$ layer, i.e., an ohmic contact layer 109.

Thereafter, a Cr film 110 with a thickness of approximately 0.1 to 0.3 µm is deposited on the entire surface by sputtering. Furthermore, an SiN film 111 with a thickness of 0.1 to 0.3 µm as a wiring protection film is deposited on the Cr film by the CVD method.

Then, third photoresist 112 is coated thereon, and the third photoresist 112 is exposed to form a pattern in the photoresist 112 by using a non-illustrated third photomask. Here, usual exposure is carried out instead of half-tone exposure. In the third photomask, a photoresist covers the drain electrode 213 part of which covers the drain opening portion 206 and the drain bus line 203 connected to the drain electrode 213; the source electrode 214 part of which covers the source opening portion 207; the gate terminal contact portion 215 extending between the gate terminal portion 210 and the gate bus line contact hole 208; and the drain terminal contact portion 216 connected to the drain terminal portion 211 at one end portion of the drain bus line 203. The film 110 is not restricted to Cr, and Mo, Al/Ti and others may be used for this film. In particular, when Al/Ti is used, the wiring protection film is no longer necessary to be deposited by oxidizing the surface of Al/Ti after pattern formation.

By dry-etching the SiN film (wiring protection film) 111 by using the third photoresist 112 subjected to exposure by the third photomask and further wet-etching the Cr film 110, the drain electrode 213, the drain bus line 203 connected to the drain electrode 213, the drain terminal contact portion 216, the source electrode 214, and the gate terminal contact portion 215 are formed as shown in FIG. 12. It is to be noted that the third photoresist 112 is removed. As a result, the drain electrode 213 electrically connects the ohmic contact layer 109 as a drain for the intrinsic a-Si film 104 with the drain bus line 203; the source electrode 214 electrically connects the ohmic contact layer 109 as a source for the intrinsic a-Si film 104 with the pixel electrode 209 (ITO film 107); the gate terminal contact portion 215 electrically connects the gate bus line 202 with the gate terminal portion 210 (ITO film 107) through the gate bus line contact hole 208; and the drain terminal contact portion 216 electrically connects the drain bus line 203 with the drain terminal portion 211 (ITO film 107).

Here, although not shown, as a step for forming the ohmic contact layer 109, a high-density n$^+$ type a-Si film having impurities such as phosphorus introduced therein may be formed under the Cr film 110 so as to have a thickness of 20 to 100 nm by the CVD method and the high-density n$^+$ type a-Si film may be brought into contact with the intrinsic a-Si film 104 at the drain opening portion 206 and the source opening portion 207. Further, in the third PR step, the SiN film (wiring protection film) 111 and the Cr film 110 are patterned into the same pattern at the same time. Incidentally, when this step is adopted, the high-density n$^+$ a-Si film is formed under each Cr film 110 of the drain electrode 213 and the source electrode 214 as well as the drain bus line 203, the gate terminal contact portion 215 and the drain terminal contact portion 216.

After forming the active matrix substrate by the third PR step, although not shown, an alignment layer is formed on the substrate, an opposed substrate having the color filter, the common electrode, the alignment layer and others formed thereon is arranged oppositely to the active matrix substrate with a small gap therebetween to be integrated, and the liquid crystal is filled between the active matrix substrate and the opposed substrate and sealed, thereby completing a color liquid crystal display. Here, since the gate insulating film 103, the intrinsic a-Si film 104, and the channel protection film 106 exist between the gate bus line 202 and the drain bus line 203 at the gate-drain intersection portion 204, a capacity at the intersection portion between the both bus lines is reduced, and a short-circuit generation rate between the both wirings is lowered. Furthermore, the light shielding portion 205 prevents the light leaking from the opposed substrate side from being incident upon the edge portion of the pixel electrode 209.

As described above, in the active matrix substrate of the first embodiment according to the present invention, the gate electrode 201, the island 231, the gate bus line 202, the gate/drain intersection portion 204, and the light shielding portion 205 are formed by utilizing the half-tone exposure in the first PR step. Moreover, in the second PR step, the pixel electrode 209, the drain opening portion 206, the source opening portion 207, the gate bus line contact hole 208, the gate terminal portion 210, and the drain terminal portion 211 are formed by utilizing the half-tone exposure. Thereafter, in the third PR step, the drain electrode 213, the source electrode 214, the drain bus line 203, the gate terminal contact portion 215, and the drain terminal contact portion 216 are formed. The active matrix substrate according to the present invention can be, therefore, manufactured by only the first to third PR steps. Consequently, a number of the PR steps in the prior art can be reduced as compared with the manufacturing method with the five PR steps or the improved four PR steps, and it is possible to cut down the cost for the manufacturing steps and produce the active matrix substrate at a low price.

Additionally, in the structure of the active matrix substrate produced by the method according to the present invention, since the intrinsic a-Si film 104, the SiN film 103 as the gate insulating film, and the Ti/Al film 102 as the gate electrode 201 are formed as the same pattern in the island 231 in particular, the channel protection film 106 covers the side surfaces of the gate electrode 201 and the island 231, especially the side surface of the intrinsic a-Si film 104, if the channel protection film 106 is formed on these films. In this connection, since dimension of the first photoresist 105 is reduced in the lateral direction by $O_2$ ashing, each of the intrinsic a-Si film 104 and the SiN film 103 has a plane shape slightly smaller than the Ti/Al film 102 as the gate electrode. As a result, since the intrinsic a-Si film 104 is protected by dense SiN, it is possible to solve a problem that impurities existing in the liquid crystal layer enter the intrinsic a-Si film 104 by diffusion or an electric field to prominently deteriorate the characteristic of the TFT when the above-described color liquid crystal display is configured.

The second embodiment according to the present invention will now be described. In the first embodiment, the pixel electrode and the drain bus line are formed on the surface of the channel protection film. Therefore, when a space between the drain bus line and the pixel electrode which are adjacent to each other is reduced, the both members may be short-circuited in the PR step, thereby lowering the manufacture yield. Thus, in order to enlarge the space between the drain bus line and the pixel electrode for improving the manufacture yield, the pixel electrode area must be reduced because a pitch size of the drain bus line can not be enlarged. An aperture ratio of the liquid crystal display is, therefore, reduced. As a countermeasure, the second embodiment proposes an active matrix substrate capable of increasing the aperture ratio. Incidentally, since the cross-sectional structure is the same as that of the first embodiment except a part of steps in the following description, the first to third PR steps are illustrated in each embodiment. In addition, same reference numerals denote equivalent parts.

FIG. 13 is a flowchart of the second embodiment according to the present invention. Further, FIGS. 14 to 16 are plane views and cross-sectional views of each step. In these drawings, (a) is a plane view, and (b), (c), (d) and (e) are cross-sectional views respectively showing an island taken along the line AA' in (a), a gate terminal portion taken along the line BB' in the same, a drain terminal portion taken along the line CC' in the same, and a gate storage portion or a common storage portion taken along the line DD' in the same. Furthermore, in (b) to (e), the cross section of each photoresist 105 separated from the substrate in case of performing half-tone exposure is shown in the simulative manner for the better understanding. It is to be noted that this is also applied to the subsequent embodiments.

At first, in FIG. 14, as similar to the first embodiment, a Ti/Al film 102, a SiN film 103 and an intrinsic a-Si film 104 are sequentially laminated, and the first PR step is then conducted by utilizing half-tone exposure, thereby forming a gate bus line 202 and an island 231 consisting of the Ti/Al film 102, a gate electrode 201 configured by lamination of the SiN film 103 and the intrinsic a-Si film 104 on the gate bus line 202, and a gate/drain intersection portion 204. It is to be noted that Cr or Mo may be used instead of Ti/Al. At this time, in the second embodiment, a separated drain bus line 233 is simultaneously formed by forming the pattern corresponding to a part of the drain bus line between the gate bus lines 202 for adjacent pixels as a half-tone portion of the first photomask. It is needless to say that the separated drain bus line 233 has a pattern shape divided in the longitudinal direction in an area crossing the gate bus line 202 so as not to be short-circuited with the gate bus line 202.

Subsequently, as shown in FIG. 15, an SiN film 106 and an ITO film 107 are laminated and the second PR step utilizing the half-tone exposure is effected as similar to the first embodiment. However, by forming the pattern corresponding to a drain bus line contact hole 217 at both end portions of the separated drain bus line 233 in the second photomask and exposing second photoresist 108 through the second photomask, the drain bus line contact hole 217 are formed together with a drain opening portion 206, a source opening portion 207 and a gate bus line contact hole 208 being formed in the same way as in the first embodiment, the secondand the both end portions of the separated drain bus line 233 are exposed from the channel protection film 106. Further, a pixel electrode 209, a gate terminal portion 210, and a drain terminal portion 211 are formed by the ITO film 107 as similar to the first embodiment.

Thereafter, as shown in FIG. 16, an ohmic contact layer is formed by PH$_3$ processing as similar to the first embodiment. Alternatively, although not shown, a high-density n$^+$ type a-Si film containing phosphorus at high density is formed by the CVD method to form the ohmic contact layer 109. Furthermore, after a Cr film 110 and an SiN film 111 are formed the third PR step is carried out so as to form a pattern in third photoresist 112 by exposing the third photoresist 112 through the third photomask generating the pattern corresponding to the connection drain bus line 263 for connecting respective opposed end portions of the separated drain bus line 233 to each other. Thereafter, by using the third photoresist 112 as a etching mask, a connection drain bus line 263 overstriding the gate bus line 202 is formed together with a drain electrode 213, a source electrode 214, a gate terminal contact portion 215, a drain terminal contact portion 216, which are formed in the same manner as in the first embodiment. It is to be noted that Mo or Al/Ti may substitute for Cr. As a result, the separated drain bus lines 233 are electrically connected to each other through the drain bus line contact hole 217 by the connection drain bus line 263 and further electrically connected to the drain terminal contact portion 216 or the drain terminal portion 211, thereby forming the continuous drain bus line 203. It is to be noted that, in the second embodiment, a light shielding portion 205 which overlaps on the edge portion of the pixel electrode 209 is simultaneously formed by a part of the Cr film in the third PR step.

In the active matrix substrate according to this second embodiment, the drain bus line 203 has a portion adjacent to the pixel electrode 209, which is formed as the separated drain bus line 233 in the same layer as the gate bus line 202. Further, this portion is formed in the layer different from that of the pixel electrode 209. Therefore, the dimension of the pixel electrode 209 can be enlarged toward the drain bus line 203, thus increasing the aperture ratio as the liquid crystal display. In this connection, in the second embodiment, although the drain bus line is divided in the first PR, instead, the gate bus line can be divided without dividing the drain bus line in the first PR, and the gate bus line can be connected in the third PR.

The third embodiment according to the present invention will now be described. In the third embodiment, usual pattern exposure is effected in the second PR step, and half-tone exposure is carried out in the third PR step. Furthermore, short-circuit of the pixel electrode and the drain bus line is also prevented to improve the manufacture yield. It is to be noted that the detailed description of the same steps as those in the first embodiment will be omitted. FIG. 17 is a process flowchart, and FIGS. 18 and 19 are plane views and cross-sectional views of each step. At first, in FIG. 18, a Ti/Al film 102, an SiN film 103, and a intrinsic a-Si film 104 are laminated and the first PR step is then conducted by first photoresist 105 utilizing half-tone exposure as similar to the first embodiment, thereby forming a gate electrode 201, an island 231, a gate bus line 202, and a gate/drain intersection portion 204. It is to be noted that, in the third embodiment, each light shielding portion 205 is formed at both side edge portions of the pixel electrode formed in the latter step, i.e., in an area adjacent to the drain bus line. Furthermore, Cr or Mo may substitute for Ti/Al.

Subsequently, as shown in FIG. 19, after depositing an SiN film 106 on the entire surface as a channel protection film, the second PR step is effected by second photoresist which has been exposed by using an usual exposure photomask, thereby forming a drain opening portion 206, a source opening portion 207, and a gate bus line contact hole 208. As a result, the surface of the intrinsic a-Si film 104 is exposed in a drain opening portion 206 and a source opening portion 207, and the surface of the Ti/Al film 102 of the gate bus line 202 is exposed in a gate bus line contact hole 208.

As shown in FIG. 20, the exposed surface of the intrinsic a-Si film 104 is then subjected to PH$_3$ processing to form an ohmic contact layer 109. An ITO film 107 is deposited on the entire surface by the sputtering method, and a Cr film 110 is further deposited thereon by the sputtering method. Moreover, an SiN film 111 as a wiring protection film is deposited thereon by the CVD method. In addition, third photoresist 112 is coated thereon, and half-tone exposure is effected by the third photomask. In the third photomask, areas corresponding to a drain electrode 213, a source electrode 214, a drain bus line 203, a gate terminal contact portion 215 and a drain terminal contact portion 216 are determined as full-pattern portions, meanwhile any other areas, i.e., an area of the pixel electrode and an area corresponding to a gate terminal portion 210 and a drain terminal portion 211 are formed as half-tone portions.

Accordingly, after developing the third photoresist 112, the SiN film 111 is dry-etched by using the third photoresist 112, and the Cr film 110 and the ITO film 107 are sequentially wet-etched. Additionally, the third photoresist 112 is subjected to O₂ ashing, and the SiN film is exposed in the half-tone portion and dry-etched. In addition, the Cr film 110 is wet-etched. As a result, only the ITO film 107 remains in an area corresponding to the half-tone portion, thereby forming a pixel electrode 209, a gate terminal portion 210 and a drain terminal portion 211. At the same time, a laminated film consisting of the Cr film and the ITO film which has remained without being etched forms a drain electrode 213, a source electrode 214, a drain bus line 203, a gate terminal contact portion 215, and a drain terminal contact portion 216. It is to be noted that Mo may constitute for Cr.

As described above, in the third embodiment, the gate bus line 202, the gate electrode 201, the island 231, the gate/drain intersection portion 204, and the light shielding portion 205 are formed by utilizing half-tone exposure in the first PR step. Further, in the second PR step, the drain opening portion 206, the source opening portion 207 and the gate bus line contact hole 208 are formed. Furthermore, the third PR step forms the pixel electrode 209, the gate terminal portion 210, the drain terminal portion 211,. the drain electrode 213, the source electrode 214, the drain bus line 203, the gate terminal contact portion 215 and the drain terminal contact portion 216. As a result, the active matrix substrate is manufactured by the three PR steps. Moreover, since the both side edge portions of the pixel electrode 209 overlap on the light shielding portion 205 in the manufactured active matrix substrate, the light shielding effect is assured in this area. In addition, the usual PR step with the good pattern accuracy (PR step which is not half-tone exposure) is used for the PR step for the source/drain opening which determines the transistor characteristics, thereby forming the transistor with the accurate dimension.

The fourth embodiment according to the present invention will now be described. It can be said that the fourth embodiment is an embodiment in which a technique for improving an aperture ratio in the second embodiment is applied to the third embodiment. It is to be noted that the detailed description of the same steps as those in the first embodiment will be omitted. FIG. 21 is a process flowchart, and FIGS. 22 and 23 are plane views and cross-sectional views of each step.

At first, in FIG. 22, as similar to the second embodiment, a Ti/Al film 102, an SiN film 103 and a intrinsic a-Si film 104 are laminated in order and the first PR step utilizing first photoresist 105 subjected to half-tone exposure is then effected, thereby forming a gate electrode 201, an island 231, a gate bus line 202, a gate/drain intersection portion 204, and a separated drain bus line 233. It is to be noted that Cr or Mo may substitute for Ti/Al.

Subsequently, as shown in FIG. 23, after the SiN film is deposited as a channel protection film on the entire surface, the second-PR step using second photoresist subjected to exposure by a regular exposure photomask is carried out so that a drain opening portion 206, a source opening portion 207, a gate bus line contact hole 208, and a drain bus line contact hole 217 are formed. By doing so, the surface of the intrinsic a-Si film 104 is exposed in the drain opening portion 206 and the source opening portion 207, and the surface of the gate bus line 202 is exposed in the gate bus line contact hole 208. Further, the surface of the separated drain bus line 233 is exposed in a drain bus line contact hole 217.

Then, as shown in FIG. 24, the exposed surface of the intrinsic a-Si film 104 is subjected to PH₃ processing to form an ohmic contact layer 109. Subsequently, an ITO film 107 is deposited on the entire surface by the sputtering method, and a Cr film 110 is deposited thereon by the sputtering method. Furthermore, an SiN film 111 as a wiring protection film is deposited thereon by the CVD method. Then, third photoresist 112 is formed thereon, and half-tone exposure is effected by the third photomask. In the third photomask, areas corresponding to a drain electrode 213, a source electrode 214, a connection drain bus line 263, a gate terminal contact portion 215 and a drain terminal contact portion 216 are determined as full-pattern portions, and any other areas, i.e., areas corresponding to a pixel electrode 209, a gate terminal portion 210 and a drain terminal portion 211 are formed as half-tone portions.

Therefore, after developing the third photoresist, the SiN film 111 is dry-etched by utilizing this third photoresist, and the Cr film 110,and the ITO film 107 are sequentially wet-etched. Furthermore, the third photoresist is subjected to O₂ ashing, and the SiN film 111 is exposed in the half-tone portion to be dry-etched. Moreover, the Cr film 110 is wet-etched. As a result, only the ITO film 107 remains in an area corresponding to the half-tone portion, thereby forming a pixel electrode 209, a gate terminal portion 210 and a drain terminal portion 211. At the same time, a laminated film consisting of the Cr film 110 and the ITO film 107 which has remained without being etched forms a drain electrode 213, a source electrode 214, a connection drain bus line 263, a gate terminal contact portion 215, and a drain terminal contact portion 216. In particular, the connection drain bus line 263 electrically connects the respective separated drain bus lines 233 sandwiching the gate bus line 202 with each other through the drain bus line contact hole 217 to constitute the continuous drain bus line 203. It is to be noted that Mo may be used instead of Cr.

As described above, in the fourth embodiment, the gate electrode 201, the island 231, the gate bus line 202, the gate/drain intersection portion 204 and the separated drain bus line 233 are formed by utilizing half-tone exposure in the first PR step, and the drain opening portion 206, the source opening portion 207, the gate bus line contact hole 208, and the drain bus line contact hole 217 are formed in the second PR step. In addition, the third PR step forms the pixel electrode 209, the gate terminal portion 210, the drain terminal portion 211, the drain electrode 213, the source electrode 214, the connection drain bus line 263, the gate terminal contact portion 215 and the drain terminal contact portion 216.

Consequently, the active matrix substrate can be manufactured by the three PR steps. Additionally, in the manufactured active matrix substrate, constituting the drain bus line 203 by forming the separated drain bus line 233 and the connection drain bus line 263 in different layers can enlarge the dimension of the pixel electrode 209 toward the drain bus line 203, thereby increasing the aperture ratio as the liquid crystal display. The fourth embodiment can adopt the gate bus line dividing method instead of the drain bus line dividing method as similar to the second embodiment. Further, as similar to the third embodiment, using the usual PR steps can improve the accuracy of the transistor dimension.

Figure 25:
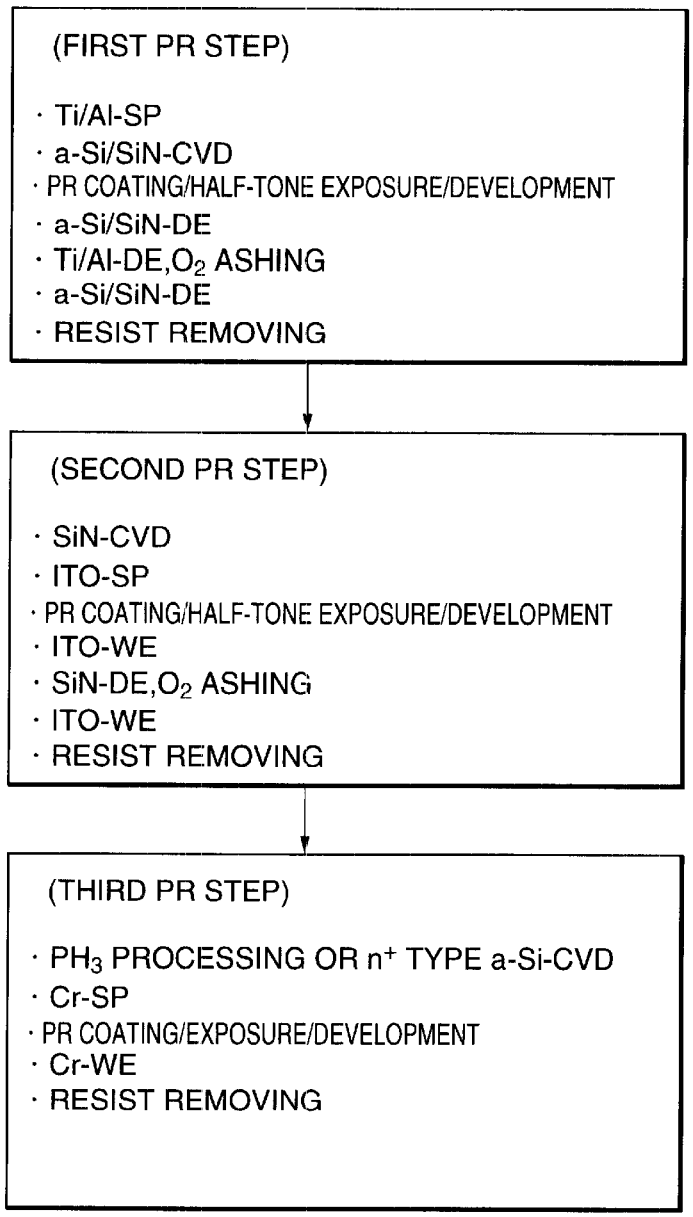
FIG. 25 is a manufacture flowchart of the fifth embodiment according to the present invention.
Figure 26A:
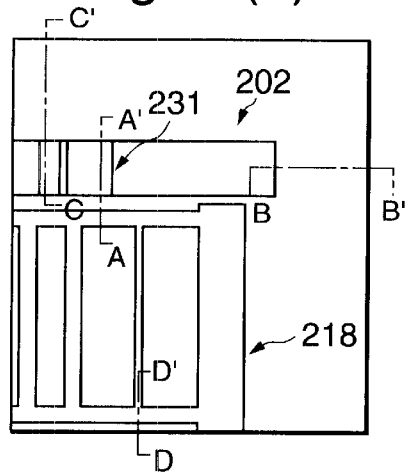
FIGS. 26(a) to (e) are a plane view and cross-sectional views of the first PR step of the fifth embodiment according to the present invention.
Figure 26B:
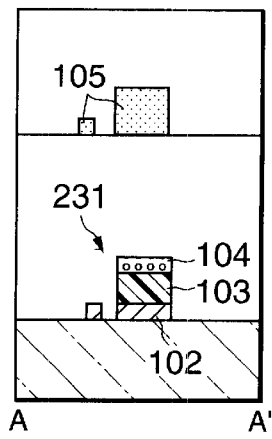
Figure 26C:
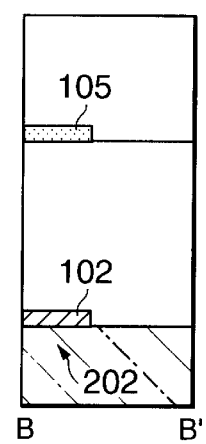
Figure 26D:
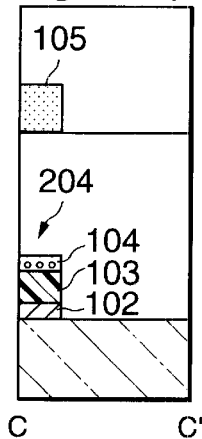
Figure 26E:
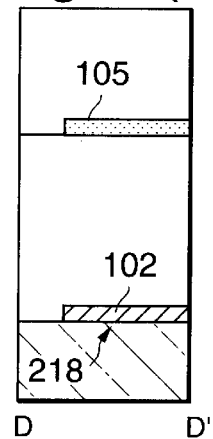
Figure 28A:
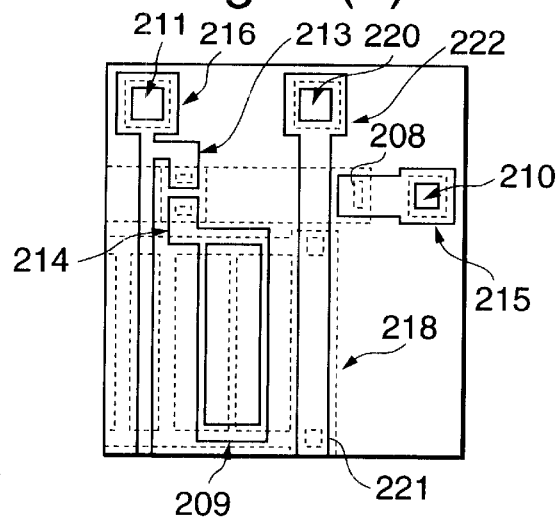
FIGS. 28(a) to (e) are a plane view and cross-sectional views showing a manufacture step continued from FIGS. 27.
Figure 28B:
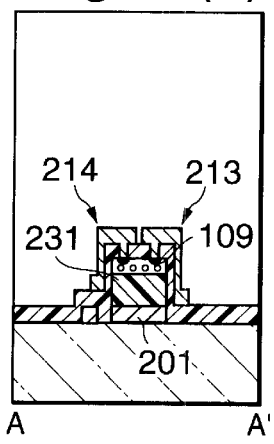
Figure 28C:
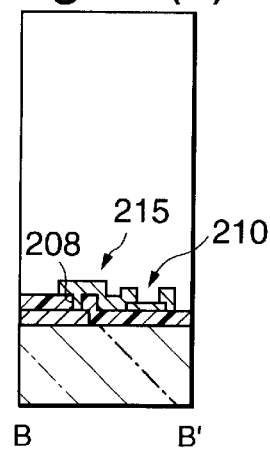
Figure 28D:
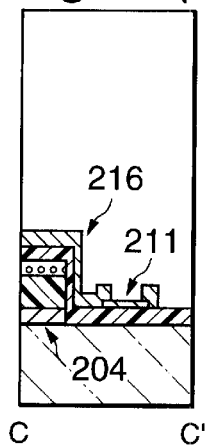
Figure 28E:
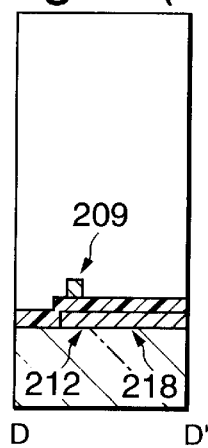

The fifth embodiment according to the present invention will now be described. The fifth embodiment is an embodiment in which the present invention is applied to an active matrix substrate adopting a lateral electric field system. FIG. 25 is a process flowchart, and FIGS. 26 to 28 are plane views and cross-sectional views of each step.

At first, in FIG. 26, a Ti/Al film 102 with a thickness of 0.1 to 0.3 μm is deposited on a transparent insulating substrate 101 by the sputtering method. Further, an SiN film (channel protection film) 103 and a intrinsic a-Si film 104 are deposited thereon with thicknesses of 0.3 to 0.5 µm and 0.05 to 0.2 µm, respectively. First photoresist 105 is coated thereon and subjected to half-tone exposure by the first photomask. Here, in regard to the first photomask, areas corresponding to a gate electrode 201, an island 231 and a gate/drain intersection portion 204 are formed as full-pattern portions, and other areas forming a comb-like (multi-frame-like) common electrode 218 and a gate bus line 202 are formed as half-tone portions. Therefore, the first photoresist 105 is developed, and the intrinsic a-Si film 104, the SiN film 103 and the Ti/Al film 102 are dry-etched. Thereafter, the first photoresist 105 is subjected to $O_2$ ashing to expose the intrinsic a-Si film 104 of the half-tone portion, and the intrinsic a-Si film 104 and the SiN film 103 are etched, thereby forming the gate electrode 201, the island 231, the common electrode 218, the gate bus line 202, and the gate/drain intersection portion 204. Cr or Mo may substitute for Ti/Al.

Subsequently, as shown in FIG. 27, the SiN film as the channel protection film is deposited on the entire surface so as to have a thickness of 0.1 to 0.4 µm by the plasma CVD method. Furthermore, the ITO film 107 with a thickness of 30 to 100 nm is formed thereon by the sputtering method. Second photoresist 108 is then applied onto the ITO film 107.

Thereafter, the second photomask is used with respect to the second photoresist 108 to effect the half-tone exposure. The second photomask used in the half-tone exposure is a mask pattern having a pattern shape corresponding to a drain opening portion 206, a source opening portion 207, a gate bus line contact hole 208 and a common electrode contact hole 219, and areas other than a gate terminal portion 210, a drain terminal portion 211 and a common electrode terminal portion 220 are constituted as half-tone portions. Thus, by wet-etching the ITO film 107 by the second photoresist 108 subjected to the half-tone. exposure by using the second photomask, each ITO film 107 in areas of the drain opening portion 206, the source opening portion 207, the gate bus line contact hole 208 and the common electrode contact hole 219 is removed by etching.

Further, the underlying SiN film (channel protection film) 106 is dry-etched. The surface of the intrinsic a-Si film 104 is exposed in the drain opening portion 206 and the source opening portion 207, and the surface of the gate bus line-202 is exposed in the gate bus line contact hole 208. Furthermore, the surface of the common electrode 218 is exposed in the common electrode contact hole 219.

Thereafter, when the second photoresist 108 is subjected to $O_2$ ashing to reduce the film thickness from the surface side, the second photoresist 108 is completely removed in the thinly formed half-tone portion in areas other than the gate terminal portion 210, the drain terminal portion 211 and the common electrode terminal portion 220, and the underlying ITO film 107 is exposed.

Subsequently, when the second photoresist 108 is again used to wet-etch the ITO film 107, the gate terminal portion 210, the drain terminal portion 211 and the common electrode terminal portion 220 are formed in the area covered with the second photoresist 108. The second photoresist is then removed. As a result, the drain opening portion 206, the source opening portion 207, the gate bus line contact hole 208, the common electrode contact hole 219, the gate terminal portion 210, the drain terminal portion 211 and the common electrode terminal portion 220 are respectively formed by the second PR step. It is to be noted that TiN may be used instead of ITO.

Subsequently, as shown in FIG. 28, the surface of the intrinsic a-Si film 104 exposed through the drain opening portion 206 and the source opening portion 207 is subjected to $PH_3$ processing to form an $n^+$ layer, i.e., an ohmic contact layer 109. Thereafter, the Cr film 110 with a thickness of approximately 0.1 to 0.3 µm is deposited on the entire surface by sputtering. Moreover, non-illustrated third photoresist is coated thereon.

The third photomask is then used with respect to the third photoresist to effect the pattern exposure. Here, usual exposure is carried out instead of half-tone exposure. The third photomask is a photomask having a pattern shape corresponding to a drain electrode 213 which covers the drain opening portion 206, a drain bus line 203 connected to the drain electrode 213, a source electrode 214 which covers the source opening portion 207, a frame-like pixel electrode 209 formed at a position shifted by a ½ pitch from the common electrode connected to the source electrode 214, a common wiring binding wire 221 extending on a common electrode contact hole 219, a gate terminal contact portion 215 extending between the gate terminal portion 210 and the gate bus line contact hole 208, a drain terminal contact portion 216 which is connected to the drain terminal portion 211 at one end portion of the drain bus line 203, and a common electrode terminal contact portion 222 connected to the common electrode terminal portion 220 at a part of the common wiring binding wire 221.

In addition, by wet-etching the Cr film 110 by using the third photoresist, the drain terminal 213, the drain bus line 203 connected to the drain electrode 213, the drain terminal contact portion 216, the source electrode 214, the frame-like pixel electrode 209 connected to the source electrode 214, the common wiring binding wire 221, the common electrode contact portion 222 connected to the common wiring binding wire 221, and the gate terminal contact portion 215 are formed. It is to be noted that a part of the pixel electrode 219 overlaps on a part of the common electrode 218 to form a common storage portion 212. Thereafter, the third photoresist is removed.

Consequently, the drain electrode 213 electrically connects the ohmic contact layer 109 as a drain of the intrinsic a-Si film 104 with the drain bus line 203, and the source electrode 214 electrically connects the ohmic contact layer 109 as a source of the intrinsic a-Si film 104 with the pixel electrode 209. In addition, the common wiring binding wire 221 electrically connects the common electrode 218 with the common electrode terminal portion 220 through the common electrode terminal contact portion 222, and the gate terminal contact portion 215 electrically connects the gate bus line 202 with the gate terminal portion 210 through the gate bus line contact hole 208.

Additionally, the drain terminal contact portion 216 electrically connects the drain bus line 203.with the drain terminal portion 211.

Here, as a step for forming the ohmic contact layer 109, a high-density $n^+$ type a-Si film into which impurities such as phosphorous are introduced may be formed to the layer under the Cr film 110 so as to have a film thickness of 20 to 100 nm by the CVD method. Further, Mo or Al/Ti may substitute for Cr.

An alignment layer is formed on the surface of the active matrix substrate formed by the above-described steps. An opposed substrate having a color filter, the alignment layer and others formed thereto is arranged so as to be opposed to the active matrix substrate with a small gap therebetween, and these substrates are then integrated. Furthermore, by filling and sealing the liquid crystal between the active matrix substrate and the opposed substrate, the color liquid crystal display is completed understandably.

As mentioned above, in the active matrix substrate of the fifth embodiment according to the present invention, the island 231, the gate bus line 202 and the common electrode 218 are formed by utilizing the half-tone exposure in the first PR step. Moreover, when the half-tone exposure is used in the second PR step, there are formed the drain opening portion 206, the source opening portion 207, the gate bus line contact hole 208, the common electrode contact hole 219, the gate terminal portion 210, the drain terminal portion 211, and the common electrode terminal portion 220. In the subsequent third PR step, the drain electrode 213, the source electrode 214, the drain bus line 203, the gate terminal contact portion 215, the drain terminal contact portion 216, the common wiring binding wire 221, and the common electrode terminal contact portion 222 are formed. Therefore, the active matrix substrate according to-the present invention can be manufactured by only the first to third PR steps, and the cost required for the manufacturing steps can be reduced to produce the active matrix substrate at a low price.

Additionally, in the structure of the produced active matrix substrate, as similar to the first to fourth embodiments, the intrinsic a-Si film 104 and the SiN film 103 as the gate insulating film constituting the island 231 are formed as a plane pattern equal to or smaller than the Ti/Al film 102 as the gate electrode. Therefore, when the channel protection film 106 is formed on these films, the channel protection film 106 covers the side surfaces of the gate electrode 201 and the island 231, and the side surface of the intrinsic a-Si film 104 in particular.

As a result, since the intrinsic a-Si film 104 is protected by dense SiN, it is needless to say that it is possible to solve the problem that the impurities existing in the liquid crystal enter the intrinsic a-Si film 104 by diffusion or an electric field to prominently deteriorate the characteristic of the TFT when the above-described color liquid crystal display is configured. Further, when the gate/drain intersection portion 204 has the SiN/a-Si/SiN structure, the capacity between the gate and the drain can be reduced, thereby decreasing a short-circuit generation ratio.

Figure 29:
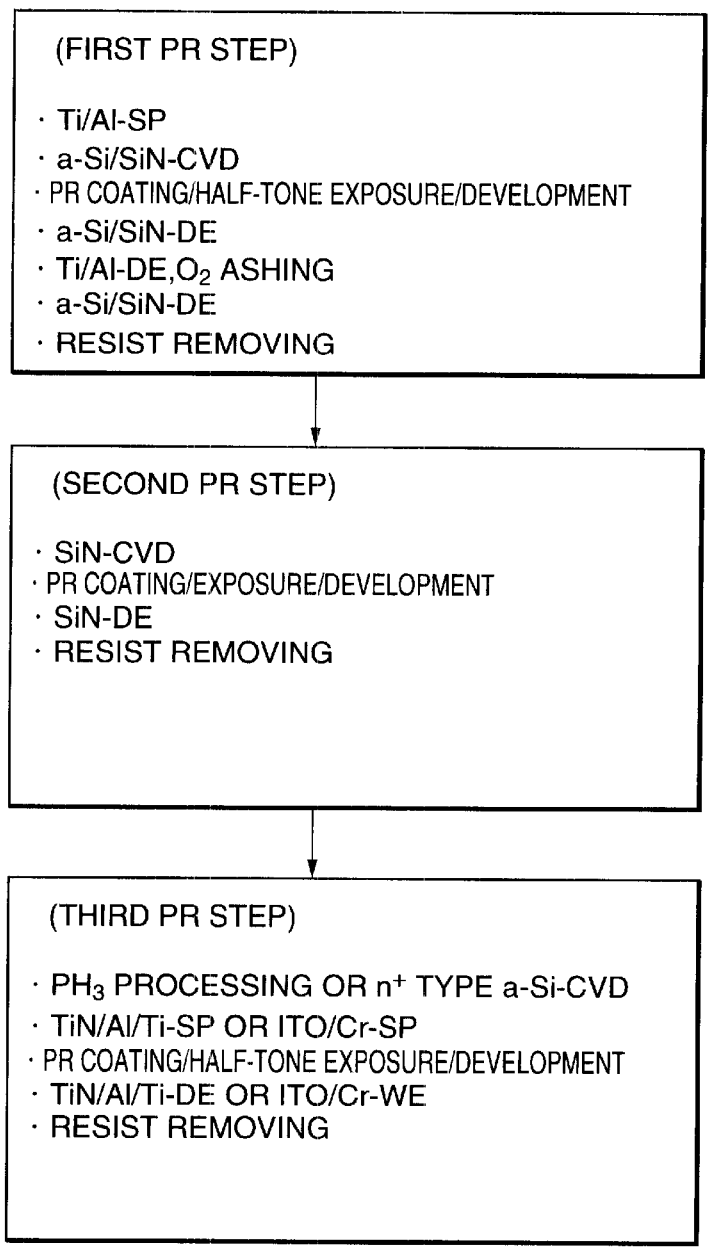
FIG. 29 is a manufacture flowchart of the sixth embodiment according to the present invention.
Figure 30A:
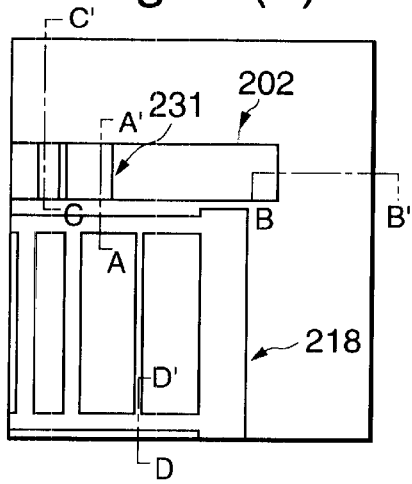
FIGS. 30(a) to (e) are a plane view and cross-sectional views of the first PR step of the sixth embodiment according to the present invention.
Figure 30B:
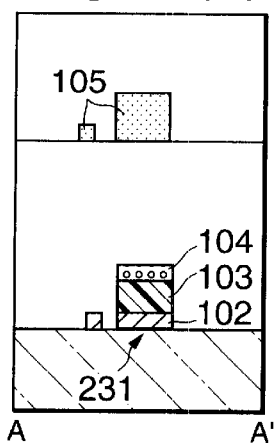
Figure 30C:
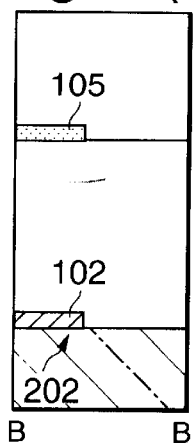
Figure 30D:
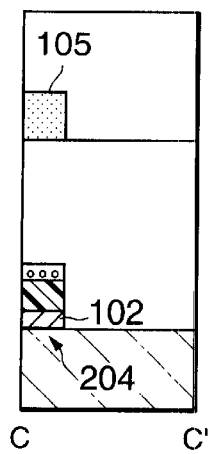
Figure 30E:
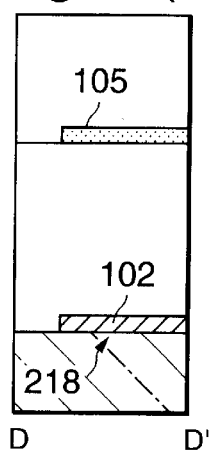
Figure 31A:
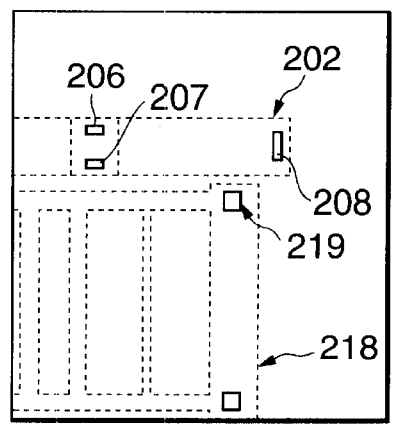
FIGS. 31(a) to (e) are a plane view and cross-sectional views showing a manufacture step continued from FIGS. 30.
Figure 31B:
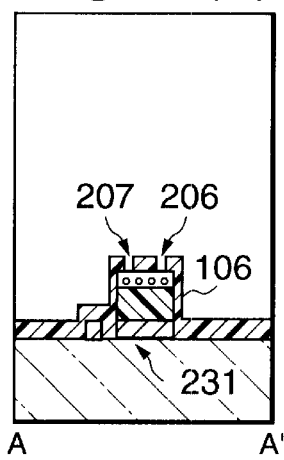
Figure 31C:
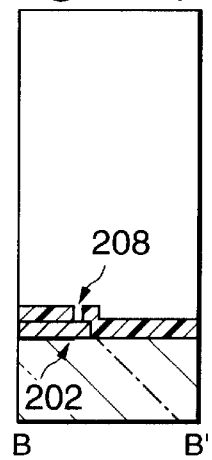
Figure 31D:
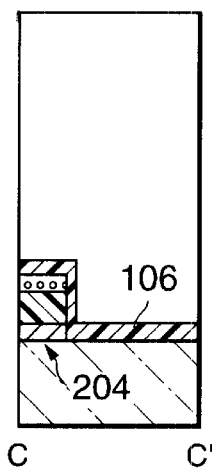
Figure 31E:
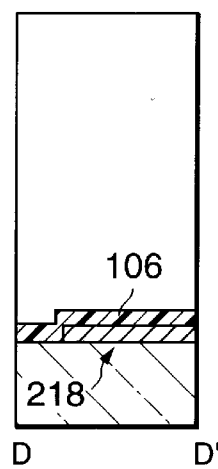
Figure 32A:
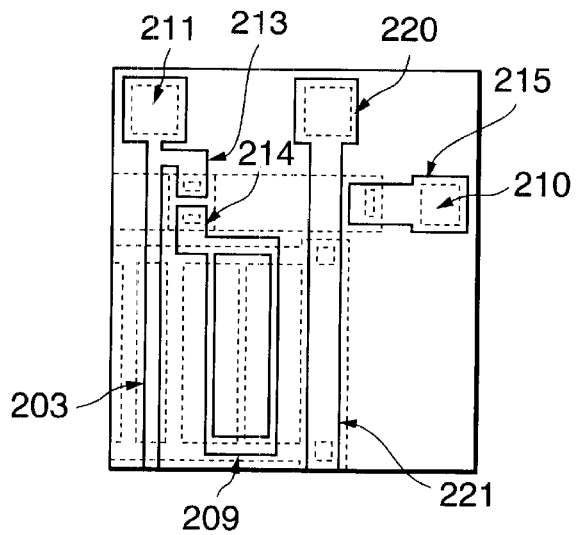
FIGS. 32(a) to (e) are a plane view and cross-sectional views showing a manufacture step continued from FIGS. 31.
Figure 32B:
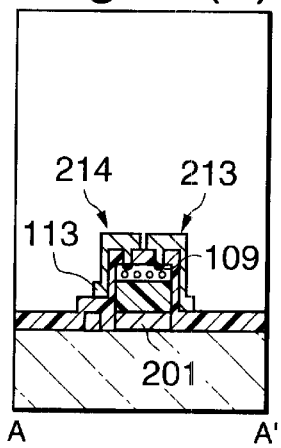
Figure 32C:
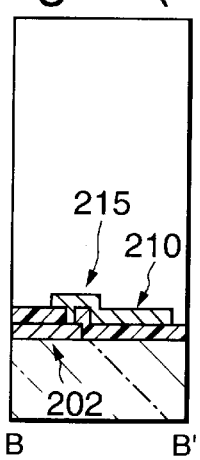
Figure 32D:
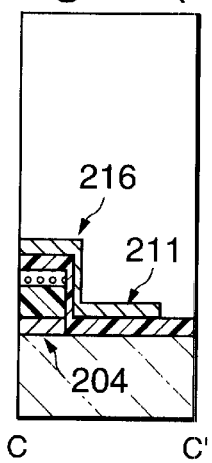
Figure 32E:
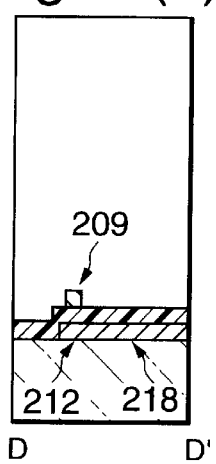
Figure 34A:
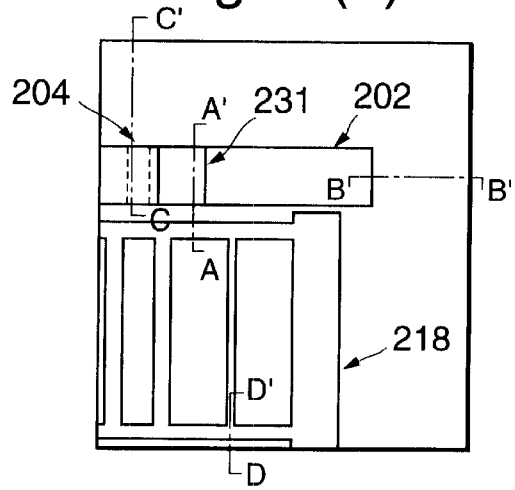
FIGS. 34(a) to (e) are a plane view and cross-sectional views of the first PR step of the seventh embodiment according to the present invention.
Figure 34B:
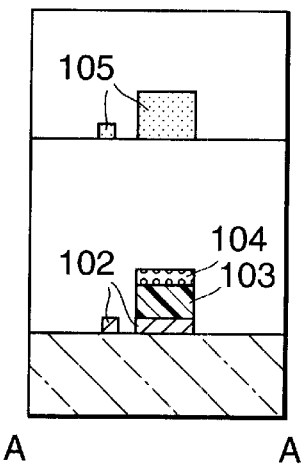
Figure 34C:
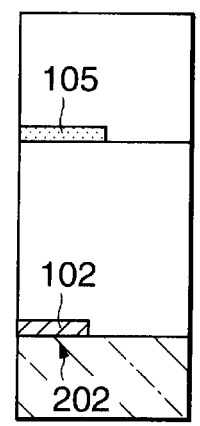
Figure 34D:
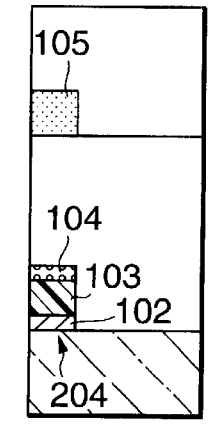
Figure 34E:
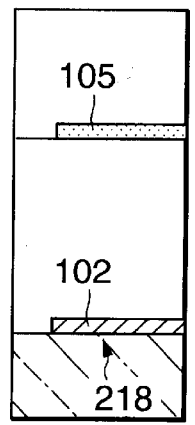
Figure 35A:
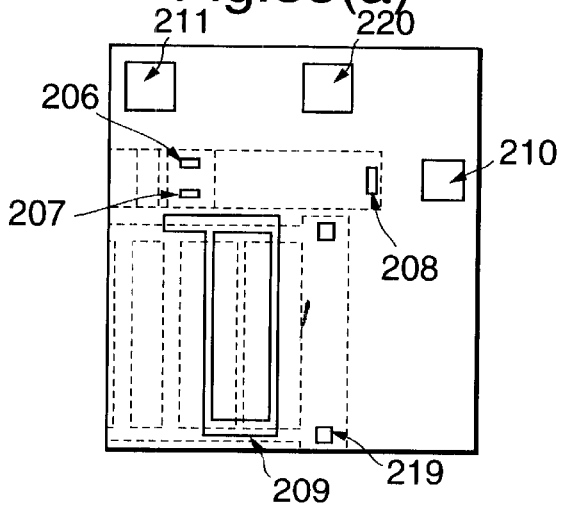
FIGS. 35(a) to (e) are a plane view and cross-sectional views showing a manufacture step continued from FIGS. 34.
Figure 35B:
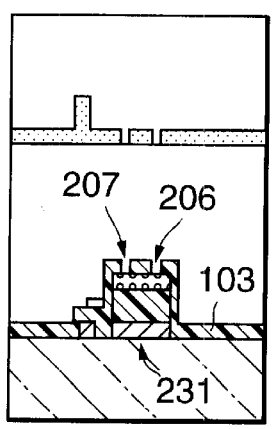
Figure 35C:
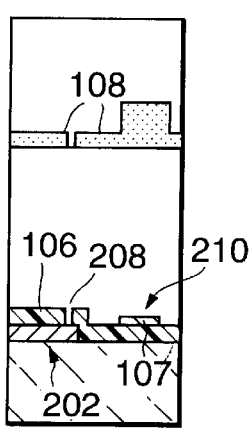
Figure 35D:
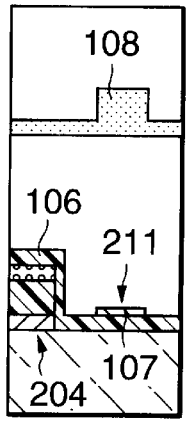
Figure 35E:
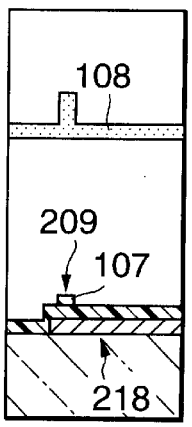
Figure 36A:
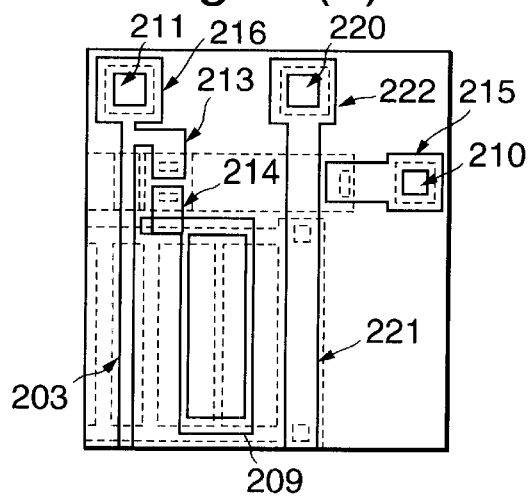
FIGS. 36(a) to (e) are a plane view and cross-sectional views showing a manufacture step continued from FIGS. 35.
Figure 36B:
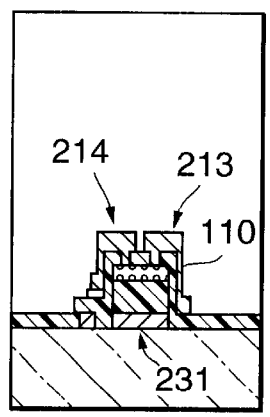
Figure 36C:
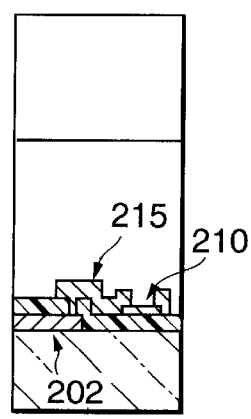
Figure 36D:
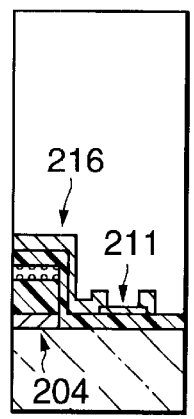
Figure 36E:
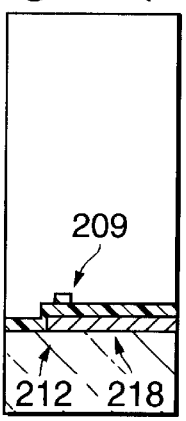
Figure 39A:
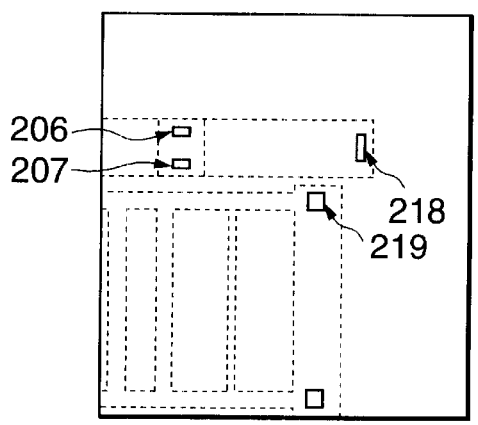
FIGS. 39(a) to (e) are a plane view and cross-sectional views showing a manufacture step continued from FIGS. 38.
Figure 39B:
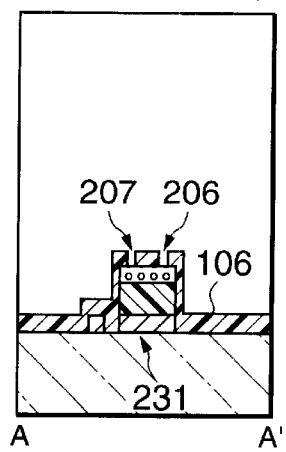
Figure 39C:
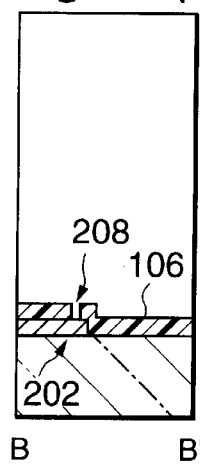
Figure 39D:
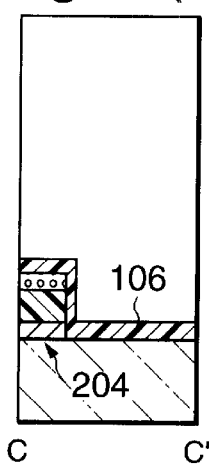
Figure 39E:
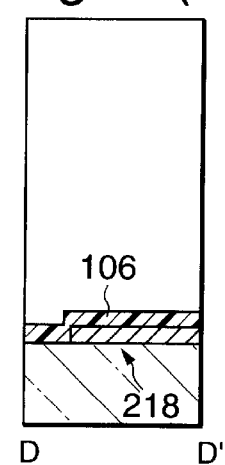
Figure 40A:
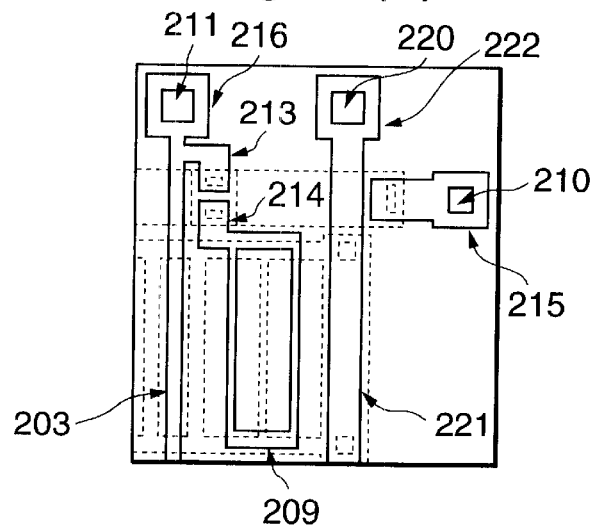
FIGS. 40(a) to (e) are a plane view and cross-sectional views showing a manufacture step continued from FIGS. 39.
Figure 40B:
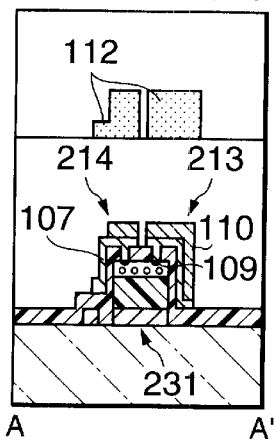
Figure 40C:
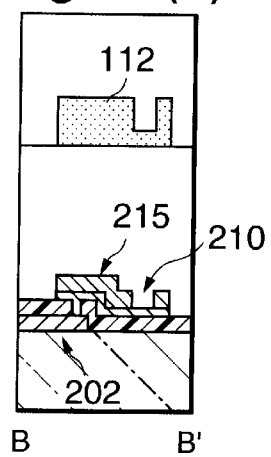
Figure 40D:
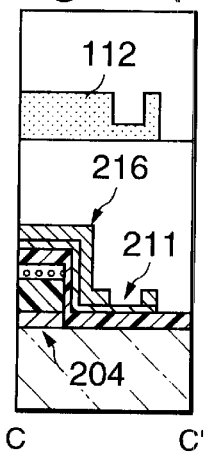
Figure 40E:
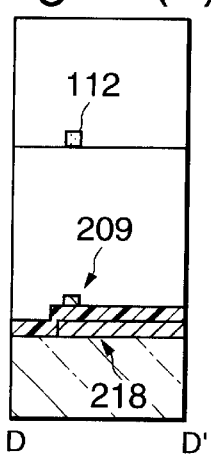
Figure 42A:
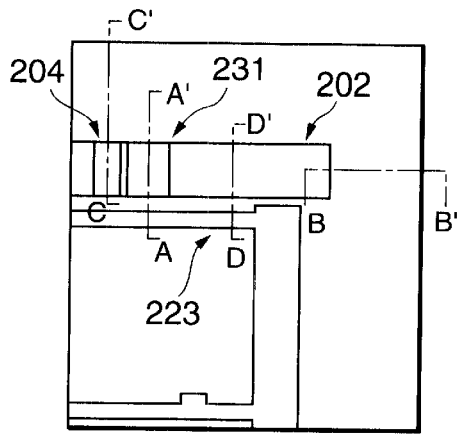
FIGS. 42(a) to (e) are a plane view and cross-sectional views of the first PR step of the ninth embodiment according to the present invention.
Figure 42B:
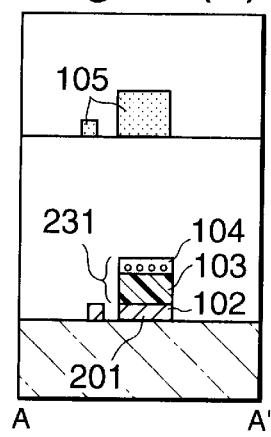
Figure 42C:
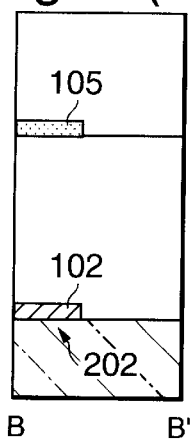
Figure 42D:
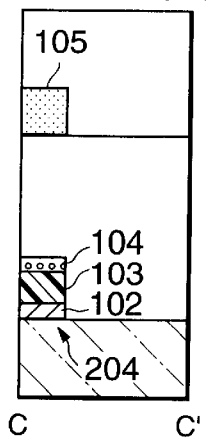
Figure 42E:
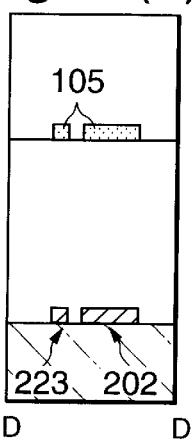
Figure 43A:
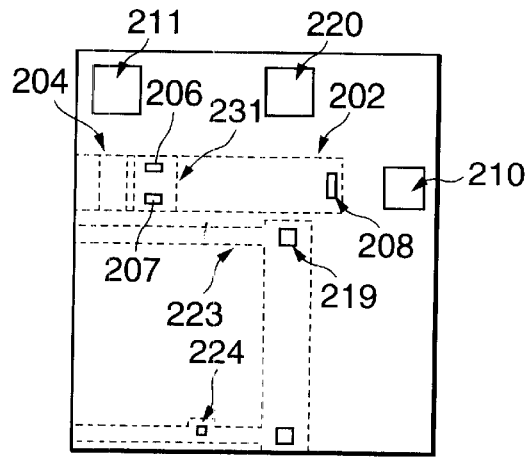
FIGS. 43(a) to (e) are a plane view and cross-sectional views showing a manufacture step continued from FIGS. 42.
Figure 43B:
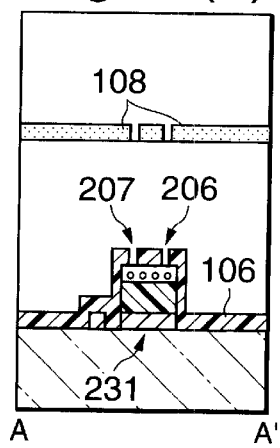
Figure 43C:
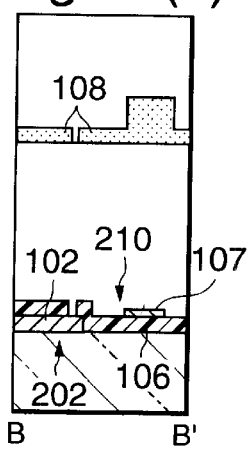
Figure 43D:
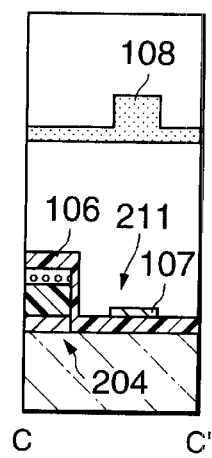
Figure 43E:
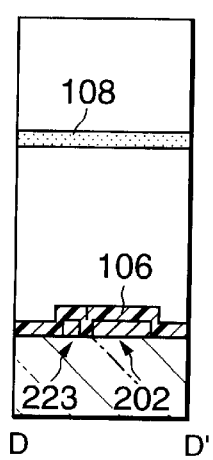
Figure 44A:
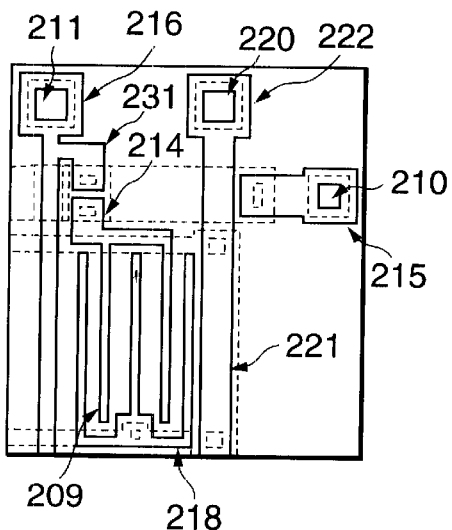
FIGS. 44(a) to (e) are a plane view and cross-sectional views showing a manufacture step continued from FIGS. 43.
Figure 44B:
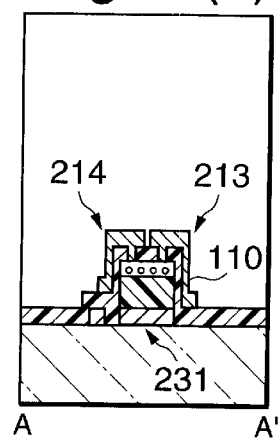
Figure 44C:
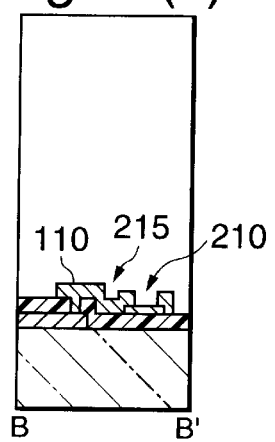
Figure 44D:
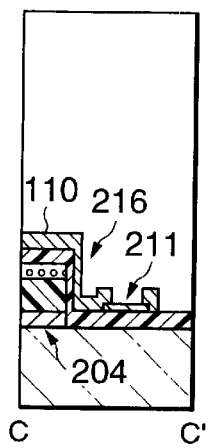
Figure 44E:
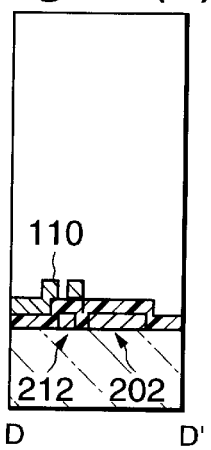

The sixth embodiment which is a modification of the fifth embodiment will now be described. FIG. 29 is a process flowchart, and FIGS. 30 to 32 are plane views and cross-sectional views of each step. In FIG. 30, the first PR step is completely the same with that in the fifth embodiment.

Then, as shown in FIG. 31, an SiN film 106 which serves as a channel protection film is deposited on the entire surface so as to have a thickness of 0.1 to 0.4 $\mu$m by the plasma CVD method. Non-illustrated second photoresist is then coated on the SiN film 106, and usual exposure using the second photomask is carried out with respect to the second photoresist. Furthermore, the SiN film 106 is dry-etched to open a drain opening portion 206, a source opening portion 207, a gate bus line contact hole 208, and a common electrode contact hole 219. The surface of a intrinsic a-Si film 104 is exposed in the drain opening portion 206 and the source opening portion 207; the surface of a gate bus line 202 is exposed in the gate bus line contact hole 208; and the surface of a common electrode 218 is exposed in the common electrode contact hole 219.

Subsequently, as shown in FIG. 32, the surface of the intrinsic a-Si film 104 exposed through the drain opening portion 206 and the source opening portion 207 is subjected to $PH_3$ processing to form an $n^+$ layer, i.e., an ohmic contact layer 109. Alternatively, the ohmic contact layer is formed, which has a high-density $n^+$ type a-Si film into which impurities such as phosphorous are introduced being formed by the CVD method.

Thereafter, an TiN/Al/Ti laminated film 113 is deposited on the entire surface by sputtering. Conceivably, an ITO/Cr laminated film may be deposited by sputtering. It is important that a metal film on the surface is formed of a metal having a ohmic-contact property in the laminated film 113. Then, applying usual exposure to the third photoresist by using the third photomask, non-illustrated third photoresist is exposed so as to form a pattern in the third photoresist. The third photomask is a photomask having a pattern shape corresponding to a drain electrode 213 which covers the drain opening portion 206, a drain bus line 203 connected to the drain electrode 213, a source electrode 214 which covers the source opening portion 207, a frame-like pixel electrode 209 which is formed by being shifted a ½ pitch from a common electrode connected to the source electrode 214, a common wiring binding wire 221 extending on the common electrode contact hole 219, a gate terminal portion 210, a drain terminal portion 211, and a common electrode terminal portion 220 connected to the common wiring binding wire 221.

Moreover, when the TiN/Al/Ti laminated film 113 is dry-etched by using the third photoresist or the ITO/Cr laminated film is wet-etched, the drain electrode 213, the drain bus line 203 connected to the drain electrode 213, the drain terminal portion 211, the source electrode 214, and a frame-like pixel electrode 209 connected to the source electrode 214, the common wiring binding wire 221, and the common electrode terminal portion 220 connected to the common wiring binding wire 221, and the gate terminal portion 210 are formed. Thereafter, the third photoresist is removed.

As a result, the drain electrode 213 electrically connects the ohmic contact layer 109 as a drain of the intrinsic a-Si film 104 with the drain bus line 203; the source electrode 214 electrically connects the ohmic contact layer as a source of the intrinsic a-Si film 104 with the pixel electrode 209; the common wiring binding wire 221 electrically connects the common wiring with the common electrode terminal portion 220; and the gate terminal portion 210 is electrically connected to the gate bus line 202 through the gate bus line contact hole 208; and the drain terminal portion 211 is electrically connected to the drain bus line 203.

As described above, in the active matrix substrate of the sixth embodiment according to the present invention, utilizing half-tone exposure in the first PR step forms the gate electrode 201, the island 231, the gate bus line 202 and the common electrode 218.

Further, in the second PR step, the drain opening portion 206, the source opening portion 207, the gate bus line contact hole 208, and the common electrode contact hole 219 are formed. In the subsequent third PR step, the drain electrode 213, the source electrode 214, the drain bus line 203, the pixel electrode 209, the common wiring binding wire 221, the gate terminal portion 210, the drain terminal portion 211, and the common electrode terminal portion 220 are formed.

Accordingly, the active matrix substrate according to the present invention can be manufactured by only the first to third PR steps utilizing half-tone exposure once, and the cost required for the manufacture steps can be reduced to produce the active matrix substrate at a low price. Since the usual PR steps are used in this embodiment as similar to the third and fourth embodiments, the accuracy of the transistor dimension can be improved.

The seventh embodiment which is another modification of the fifth embodiment will now be described. FIG. 33 is a process flowchart, and FIGS. 34 and 35 are plane views and cross-sectional views of each step. In FIG. 34, the first PR step utilizing half-tone exposure is completely the same as that in the fifth embodiment. Furthermore, as shown in FIG. 35, the second PR step utilizing half-tone exposure is similar to that in the fifth embodiment.

In the second PR step of this embodiment, however, a pattern shape of the second mask is different from that in the fifth embodiment, and the SiN film as a channel protection film is dry-etched so that the drain opening portion 206, the source opening portion 207, the gate bus line contact hole 208 and the common electrode contact hole 219 are opened. Moreover, the gate terminal portion 210, the drain terminal portion 211, the common electrode terminal portion 220 as well as the pixel electrode 209 are simultaneously formed by using the ITO film.

In addition, as shown in FIG. 36, the surface of the intrinsic a-Si film 104 exposed through the drain opening portion 206 and the source opening portion 207 is subjected to $PH_3$ processing to form an $n^+$ layer, i.e., an ohmic contact layer 109, as similar to the fifth embodiment. Alternatively, a high-density $n^+$ type a-Si film is deposited by the CVD method to form the ohmic contact layer. Then, the Cr film 110 is deposited on the entire surface so as to have a thickness of approximately 0.1 to 0.3 $\mu$m by sputtering, and this film is wet-etched by non-illustrated third photoresist subjected to usual exposure by the third photomask. Consequently, there are formed the drain electrode 213, the drain bus line 203 connected to the drain electrode 213, the drain electrode contact portion 216, the source electrode 214 connected to the pixel electrode 209, the common wiring binding wire 221, the common electrode contact portion 222 connected to the common wiring binding wire 221, and the gate terminal contact portion 215.

As a result, the drain electrode 213 electrically connects the ohmic contact layer 109 as a drain of the intrinsic a-Si film 104 with the drain bus line 203; the source electrode 214 electrically connects the ohmic contact layer 109 as a source of the intrinsic a-Si film 104 with the pixel electrode 209; the common wiring binding wire 221 electrically connects the common wiring with the common electrode terminal portion 220 through the common electrode terminal contact portion 222; the gate terminal contact portion 215 electrically connects the gate bus line 202 with the gate terminal portion 210 through the gate bus line contact hole 208; and the drain terminal contact portion 216 electrically connects the drain bus line 203 with the drain terminal portion 211. It is to be noted that Mo or Al/Ti may substitute for Cr.

As described above, in the active matrix substrate of the seventh embodiment according to the present invention, since the pixel electrode 209 is formed by the ITO film 107 and the source electrode 214 which is thereafter formed is electrically connected to the pixel electrode 209 in the second PR step, the pixel electrode 209 can be formed thinner as compared with the sixth embodiment.

The eighth embodiment which is still another modification of the fifth embodiment will now be described. FIG. 37 is a process flowchart, and FIGS. 38 to 40 are plane views and cross-sectional views of each step. In FIG. 38, the first PR step utilizing half-tone exposure is completely the same as that in the fifth embodiment. Further, as shown in FIG. 39, the second PR step utilizing usual exposure is similar to that in the sixth embodiment.

The island 231, the gate bus line 202 and the common electrode 218 are formed by these first and second PR steps, and the drain opening portion 206, the source opening portion 207, the gate bus line contact hole 208 and the common electrode contact hole 219 are opened through the SiN film 106 which is deposited on the aforesaid members as a channel protection film.

Subsequently, as shown in FIG. 40, the surface of the intrinsic a-Si film 104 exposed through the drain opening portion 206 and the source opening portion 207 is subjected to $PH_3$ processing to form an $n^+$ layer, namely, an ohmic contact layer 109. Alternatively, a high-density $n^+$ type a-Si film is deposited by the CVD method to form the ohmic contact layer. Thereafter, the ITO film 107 is deposited so as to have a thickness of 30 to 100 nm by the sputtering method. It is to be noted that an TiN film may be used instead of the ITO film.

Moreover, the Cr film 110 is deposited thereon so as to have a thickness of approximately 0.1 to 0.3 $\mu$m by. sputtering. In addition, third photoresist 112 subjected to half-tone exposure by using the third photomask is utilized to sequentially wet-etch the Cr film 110 and the ITO film. Thereafter, the third photoresist is subjected to $O_2$ ashing, and only the Cr film 110 is wet-etched. As a result, the pixel electrode 209, the gate terminal portion 210, the drain terminal portion 211, and the common electrode terminal portion 220 are formed in areas in which only the ITO film 107 remains. Meanwhile, the drain electrode 213, the drain bus line 203 connected to the drain electrode 213, the drain terminal contact portion 216, the source electrode 214 connected to the pixel electrode 209, the common wiring binding wire 221, the common electrode contact portion 222 connected to the common wiring binding wire 221, and the gate terminal contact portion 215 are formed in areas in which the Cr film 110 and the ITO film 107 are laminated. It is to be noted that Mo/ITO, Cr/TiN, Mo/TiN or Al/TiN may substitute for Cr/ITO.

As described above, in the active matrix substrate of the eighth embodiment according to the present invention, when half-tone exposure is utilized in the third PR step, the pixel electrode 209 and the respective terminal portions 210, 211 and 220 are formed by the ITO film 107 having the ohmic-contact property and the respective bus lines 203 and 221 and the respective contact portions 215, 216 and 221 are formed by the Cr film 110 having the low resistance at the same time. Since the usual PR steps are used in this embodiment as similar to the third and fourth embodiments, the accuracy of the transistor dimension can be improved.

The ninth embodiment which is yet another modification of the fifth embodiment will now be described. FIG. 41 is a process flowchart, and FIGS. 42 to 44 are plane views and cross-sectional views of each step.

In FIG. 42, although the first PR step utilizing half-tone exposure is similar to that in the fifth embodiment, the common electrode is not formed but only the common wiring 223 is formed in this embodiment.

Further, as shown in FIG. 43, in the second PR step utilizing half-tone exposure, the SiN film as a channel protection film is dry-etched, and the drain opening portion 206, the source opening portion 207, the gate bus line contact hole 208, the common electrode contact hole 219, and the common wiring contact hole 224 are opened.

Furthermore, the gate terminal portion 210, the drain terminal portion 211 and the common electrode terminal portion 220 are formed by the ITO film.

Moreover, as shown in FIG. 44, the surface of the intrinsic a-Si film 104 exposed through the drain opening portion 206 and the source opening portion 207 is subjected to $PH_3$ processing to form an n$^+$ layer, namely, an ohmic contact layer 109. Alternatively, a high-density n$^+$ type a-Si film is deposited by the CVD method to form the ohmic contact layer.

Thereafter, the Cr film is deposited on the entire surface so as to have a thickness of approximately 0.1 to 0.3 μm by sputtering, and this film is wet-etched by non-illustrated third photoresist subjected to usual exposure by the third photomask, thereby forming the drain electrode 213, the drain bus line 203 connected to the drain electrode 213, the drain terminal contact portion 216, the pixel electrode 209, the source electrode 214 connected to the pixel electrode 209, the common electrode 218 connected to the common wiring 223 through the common electrode contact hole 224, the common wiring binding wire 221 connected to the common wiring 223 through the common electrode contact hole 219, the common electrode contact portion 222, and the gate terminal contact portion 215.

As a result, the drain electrode 213 electrically connects the ohmic contact layer 109 as a drain of the intrinsic a-Si film 104 with the drain bus line 203; the source electrode 214 electrically connects the ohmic contact layer as a source of the intrinsic a-Si film 104 with the pixel electrode 209; the common wiring binding wire 221 electrically connects the common wiring 223 or the common electrode 218 with the common electrode terminal portion 220 through the common electrode terminal contact portion 222; the gate terminal contact portion 215 electrically connects the gate bus line 202 with the gate terminal portion 210 through the gate bus line contact hole 208; and the drain terminal contact portion 216 electrically connects the drain bus line 203 with the drain terminal portion 211. It is to be noted that Mo or Al/Ti may substitute for Cr.

Figure 45:
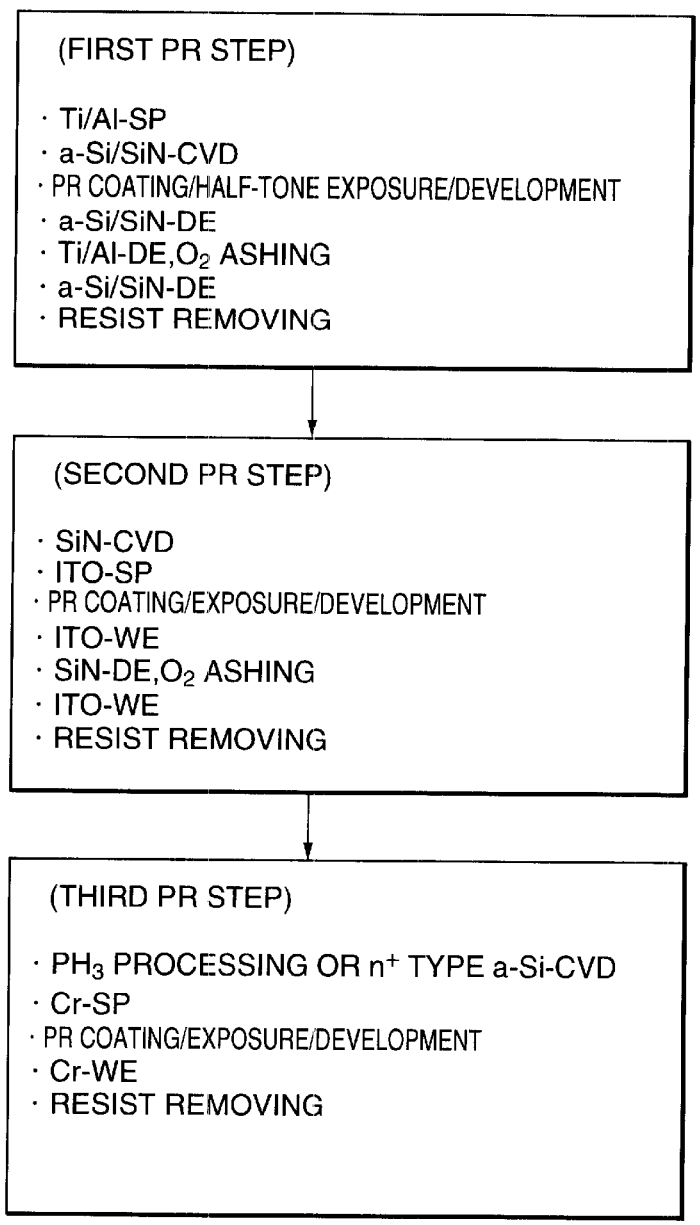
FIG. 45 is a manufacture flowchart of the tenth embodiment according to the present invention.
Figure 46A:
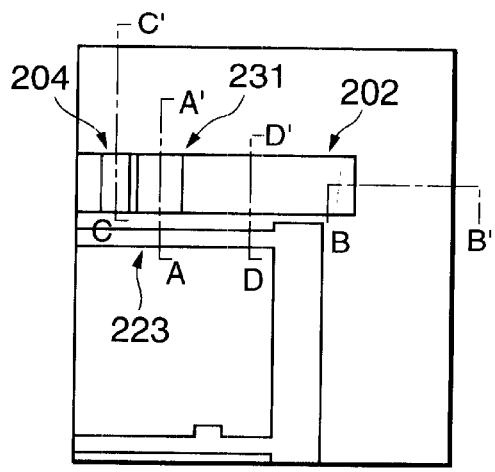
FIGS. 46(a) to (e) are a plane view and cross-sectional views showing the first PR step of the tenth embodiment according to the present invention.
Figure 46B:
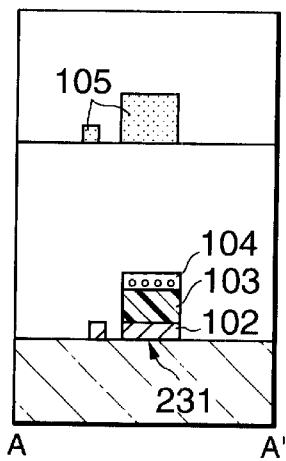
Figure 46C:
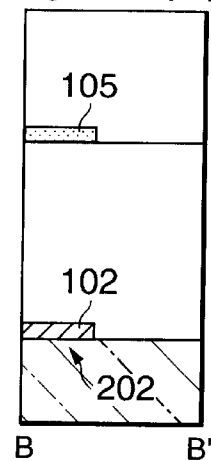
Figure 46D:
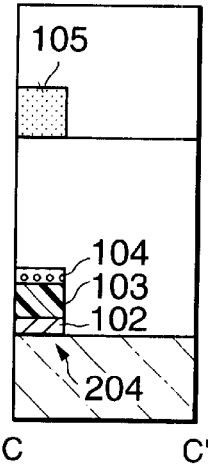
Figure 46E:
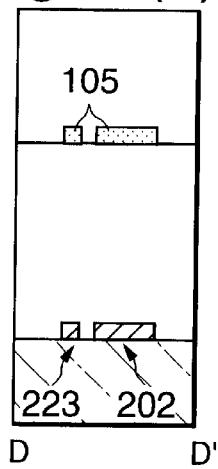
Figure 47A:
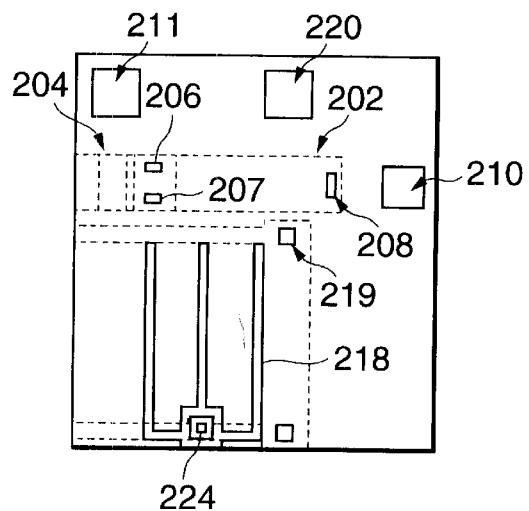
FIGS. 47(a) to (e) are a plane view and cross-sectional views showing a manufacture step continued from FIGS. 46.
Figure 47B:
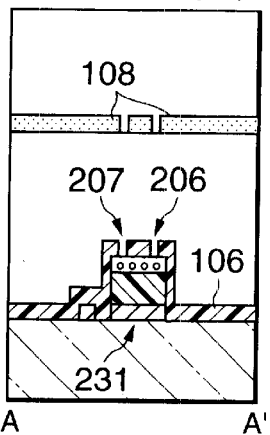
Figure 47C:
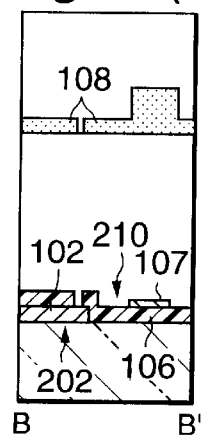
Figure 47D:
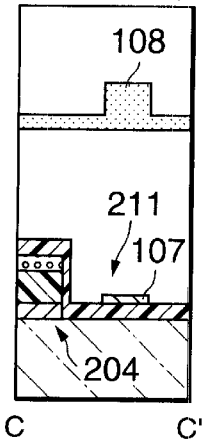
Figure 47E:
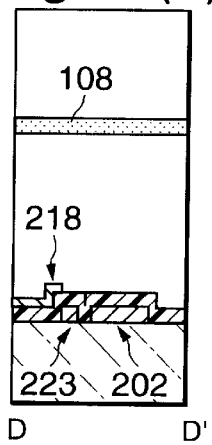
Figure 48A:
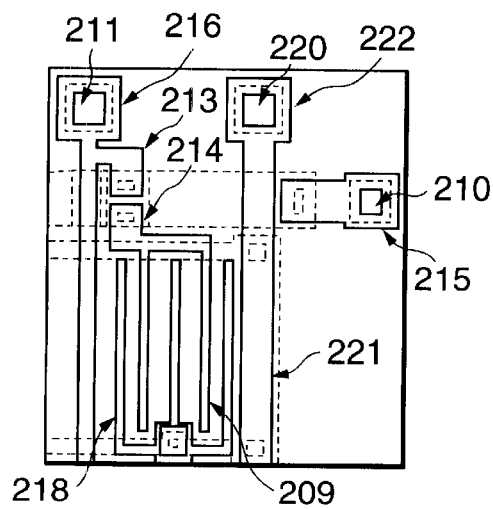
FIGS. 48(a) to (e) are a plane view and cross-sectional views showing a manufacture step continued from FIGS. 47.
Figure 48B:
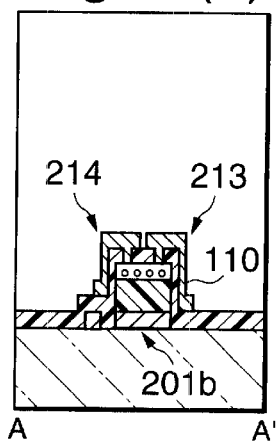
Figure 48C:
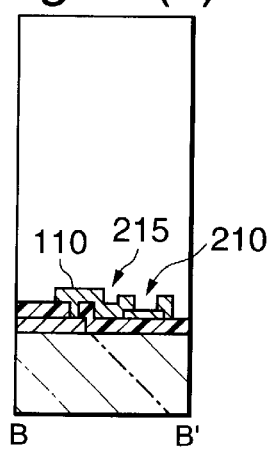
Figure 48D:
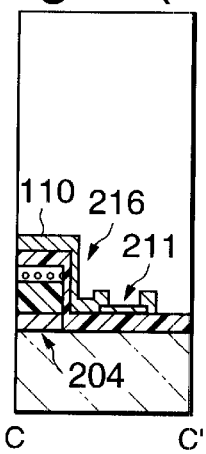
Figure 48E:
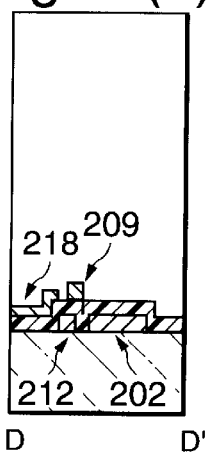

The tenth embodiment which is a modification of the ninth embodiment will now be described. FIG. 45 is a process flowchart and FIGS. 46 to 48 are plane views and cross-sectional views of each step.

In FIG. 46, the first PR step utilizing half-tone exposure is similar to that in the ninth embodiment and the common wiring 223 is formed.

Moreover, as shown in FIG. 47, in the second PR step utilizing half-tone exposure, the SiN film as a channel protection film is dry-etched, and the drain opening portion 206, the source opening portion 207, the gate bus line contact hole 208, the common electrode contact hole 219, and the common wiring contact hole 224 are opened. In addition, the gate terminal portion 210, the drain terminal portion 211, and the common electrode terminal portion 220 are formed by the ITO film. Also, the common electrode 218 connected to the common wiring 223 through the common wiring contact hole 224 is formed.

Additionally, as shown in FIG. 48, the surface of the intrinsic a-Si film 104 exposed through the drain opening portion 206 and the source opening portion 207 is subjected to $PH_3$ processing to form an n$^+$ layer, i.e., an ohmic contact layer 109. Alternatively, a high-density n$^+$ type a-Si film is deposited by the CVD method to form the ohmic contact layer.

Thereafter, the Cr film 110 is depositeded on the entire surface so as to have a thickness of approximately 0.1 to 0.3 μm by sputtering, and this film is wet-etched by non-illustrated third photoresist subjected to usual exposure using the third photomask, thereby forming the drain electrode 213, the drain bus line 203 connected to the drain electrode 213, the drain terminal contact portion 216, the pixel electrode 209, the source electrode 214 connected to the pixel electrode 209, the common wiring binding wire 221 connected to the common wiring 223 through the common electrode contact hole 219, the common electrode contact portion 222, and the gate terminal contact portion 215.

As a result, the drain terminal 213 electrically connects the ohmic contact layer 109 as a drain of the intrinsic a-Si film 104 with the drain bus line 203; the source electrode 214 electrically connects the ohmic contact layer 109 as a source of the intrinsic a-Si film 104 with the pixel electrode 209; the common wiring binding wire 221 electrically connects the common wiring 223 or the common electrode 218 with the common electrode terminal portion 220 through the common electrode terminal contact portion 222; the gate terminal contact portion 215 electrically connects the gate bus line 202 with the gate terminal portion 210 through the gate bus line contact hole 208; and the drain terminal contact portion 216 electrically connects the drain bus line 203 with the drain terminal portion 211. It is to be noted that Mo or Al/Ti may be used in place of Cr.

Figure 49A:
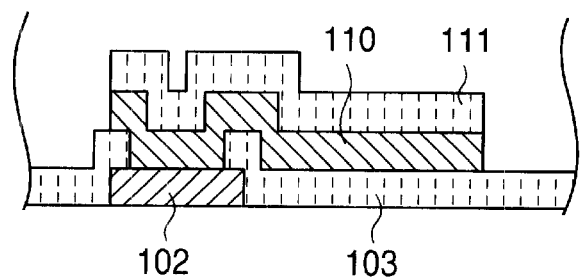
FIGS. 49(a) to (d) are cross-sectional views of a gate/drain connection portion of each embodiment.
Figure 49B:
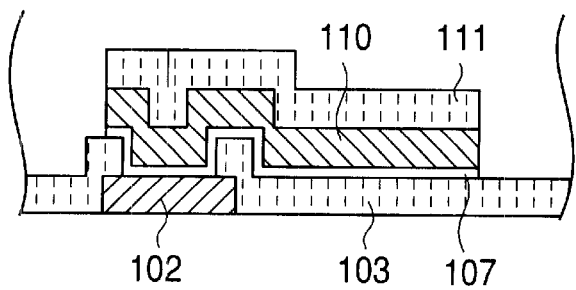
Figure 49C:
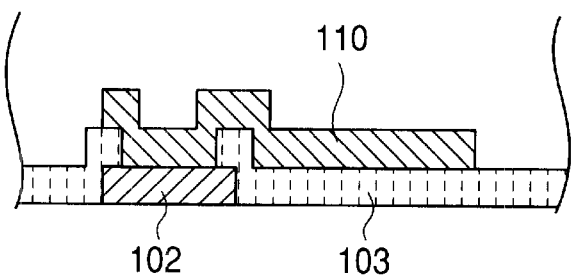
Figure 49D:
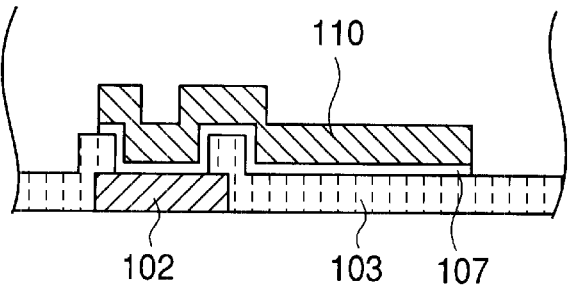

Here, each embodiment has a protection element 225 shown in FIG. 3. In case of forming this protection element, the gate metal and the drain metal must be electrically connected to each other. Although the detailed description of the structure of this gate/drain connection portion is omitted, the structure of each gate/drain connection portion in each of the foregoing embodiments is as shown in FIG. 49. FIG. 49(a) shows the structure in the embodiments 1 and 2; FIG. 49(b), the structure in the embodiments 3 and 4; FIG. 49(c), the structure in the embodiments 5, 6, 7, 9 and 10; and FIG. 49(d), the structure in the embodiment 8.

Further, in each embodiment, the half-tone exposure method is used as a technique for pattern-forming the photoresist so as to provide different thicknesses, but a double exposure method may be used instead.

Figure 50A:
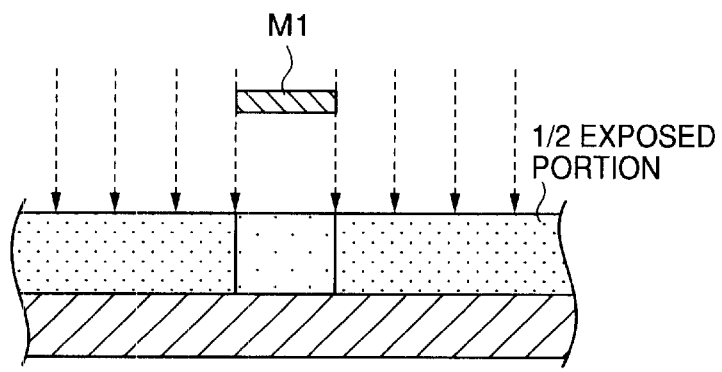
FIGS. 50(a) to (c) are process charts for explaining a double exposure, method.

According to this double exposure method, as shown in FIG. 50(a), the first exposure is carried out with an exposure quantity less than the usual exposure quantity, for example, ½ by using a mask M1 which masks areas in which the photoresist is thickly formed.

Figure 50B:
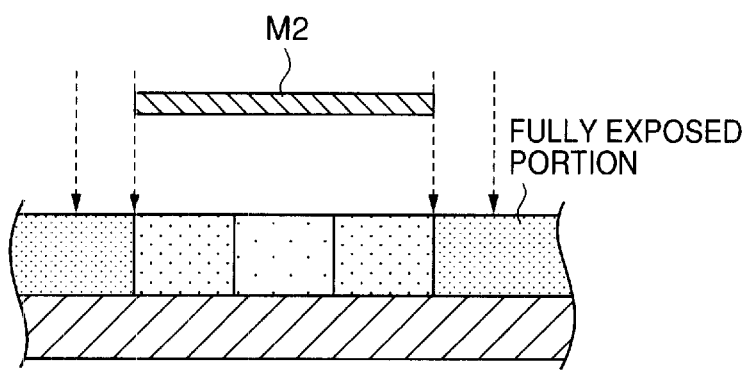
Figure 50C:
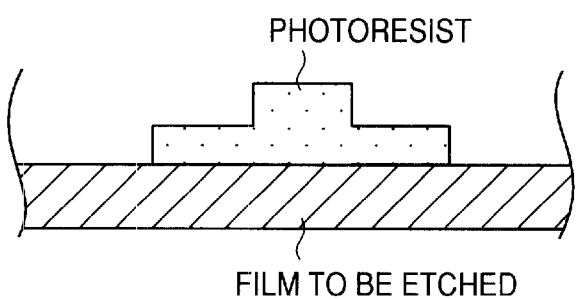

Then, as shown in FIG. 50(b), exposure is effected with an usual exposure quantity by using a mask M2 which masks areas including an area in which the photoresist is thinly formed. Thereafter, by developing the photoresist, the photoresist patterned with different thicknesses can be formed as shown in FIG. 50(c). According to this double exposure method, although a number of times of exposure becomes two, a number of times of PR coating, development and removing steps can be reduced by one as compared with the case where the two PR steps are carried out.

As described above, in the active matrix substrate according to the present invention, as the structure of the gate island composed of the laminated configuration of the gate electrode, the gate insulating film and the semiconductor film for constituting the thin film transistor, the gate insulating film and the semiconductor film are formed into a plane shape equal to or smaller than the gate electrode and covered with the channel protection film, and the drain electrode and the source electrode are formed to the semiconductor film through the openings provided to the channel protection film. Therefore, the side surfaces of the semiconductor film and the gate insulating film can be covered with the channel protection film formed thereon, and impurities existing in the liquid crystal layer can be prevented from entering the semiconductor film by diffusion or an electric field, thereby improving the characteristic of the TFT.

Further, according to the manufacture method of the present invention, the half-tone exposure method is used in two PR steps in manufacture of the active matrix substrate adopting the vertical electric field system, and the half-tone exposure method is used in at least one PR step in manufacture of the active matrix substrate of the lateral electric field system. As a result, the active matrix substrate can be produced by only three PR steps, and the cost of the active matrix substrate can be further reduced.

What is claimed is:

1. An active matrix substrate manufacturing method comprising the steps of:

forming a first laminated film having a plurality of films laminated on a transparent insulating substrate and forming a fist resist mask consisting of a first thick resist portion having a large film thickness and a first thin resist portion having a film thickness smaller than that of said first thick resist portion on said first laminated film;

etching said first laminated film with said first resist mask as a mask to form a first pattern consisting of said first laminated film;

etching said first resist mask to remove said first thin resist portion and forming a first remaining resist mask having said first thick resist portion remaining on said first pattern to expose a part of said first pattern; and etching an exposed part of said first pattern with said first remaining resist mask as a mask to remove at least a film of an uppermost layer constituting said first pattern and forming a second pattern consisting of films of said first laminated film excluding a film of an uppermost layer thereof.

2. The active matrix substrate manufacturing method according to claim 1, wherein said first laminated film is formed by sequentially depositing a first conductive film, a gate insulating film and a semiconductor film on said transparent insulating substrate, said first resist mask is formed by using a half-tone exposure method, said first pattern is formed by etching said first laminated film with said first resist mask as a mask, etching of said first resist mask is carried out by applying ashing to said first resist mask, and said second pattern is formed by removing said semiconductor film and said gate insulating film in said first pattern with said first remaining resist mask as a mask to form said second pattern consisting of a first conductive film.

3. The active matrix substrate manufacturing method according to claim 2, wherein said step of forming said second pattern is followed by the steps of:

sequentially depositing an interlayer insulating film covering said first pattern and said second pattern and a second conductive film to obtain a second laminated film after removing said first remaining resist mask;

forming a second resist mask consisting of a second thick resist portion having a large film thickness and a second thin resist portion having a film thickness smaller than that of said second thick resist portion on said second conductive film;

etching said second laminated film on said first pattern and said second pattern with said second resist mask as a mask to form an opening portion as a third pattern consisting of said second laminated film on said first pattern and said second pattern;

etching said second resist mask and removing said second thin resist portion to form a second remaining resist mask having said second thick resist portion remaining on said third pattern, and exposing a part of said third pattern at least in the vicinity of said opening portion;

etching an exposed part of said third pattern with said second remaining resist mask as a mask and removing a second conductive film of an uppermost layer constituting said third pattern to form a fourth pattern consisting of said interlayer insulating film so that said opening portion serves as a contact through hole; and forming wirings consisting of a third conductive film connected to said first pattern and said second pattern respectively exposed in said opening portion after removing said second remaining resist mask.

4. The active matrix substrate manufacturing method according to claim 3, wherein said semiconductor film has a V-equivalent element introduced to the surface of an intrinsic semiconductor film, the surface of said intrinsic semiconductor film being caused to have the low resistance.

5. The active matrix substrate manufacturing method according to claim 3, wherein said semiconductor film is an intrinsic semiconductor film, and a step of lowering the resistance at a part of said intrinsic semiconductor film exposed in said contact through hole by applying plasma processing of a V-equivalent element to said part of said true semiconductor film exposed in said contact through hole is interposed between said step of forming said fourth pattern and said step of forming said wiring.

6. The active matrix substrate manufacturing method according to claim 3, wherein in said step of forming said first pattern, said first conductive film constitutes a gate wiring including a gate electrode, and said first pattern is formed in accordance with a TFT and an intersection portion of a drain wiring formed in a later step and said gate wiring;

in said step of forming said second pattern, said second pattern is formed in accordance with said gate wiring excluding said gate electrode and said intersection portion;

in said step of forming said third pattern, said third pattern constitutes at least a gate terminal electrode and a drain terminal electrode, and a pixel electrode is formed on said gate wring so as to partially overlap on said gate wiring with said interlayer insulating film constituting said third pattern therebetween when said third pattern includes said pixel electrode surrounded by said gate wiring and said drain wiring; and in said step of forming said wiring, a drain electrode consisting of said third conductive film connected to said semiconductor film through a contact through hole formed on said semiconductor film constituting a TFT and a drain wiring consisting of said third conductive film are formed, a source electrode consisting of said third conductive film connected to said semiconductor film through a contact through hole different from said contact through hole formed on said semiconductor film constituting said TFT is formed, a gate wiring drawing electrode connected to said gate wiring through a contact through hole formed on said gate wiring is formed, said drain wiring is formed crossing over said intersection portion and in contact with the periphery of said drain terminal electrode, said source electrode is formed partially in contact with said pixel electrode, and said gate wiring drawing electrode is formed in contact with the periphery of said gate terminal electrode.

7. The active matrix substrate manufacturing method according to claim 6, wherein in said step of forming said second pattern, said second pattern is formed with a separated drain electrode between said gate wirings;
in said step of forming said contact through hole, a contact through hole is also formed on said separated drain electrode; and
in said step of forming said wiring, said drain wiring drawing electrode connected to said separated drain electrode through said contact through hole on said separated drain electrode is formed.

8. The active matrix substrate manufacturing method according to claim 6, wherein in said step of forming said second pattern, said second pattern includes a common electrode having a comb-like electrode as well as said gate wiring; and
in said step of forming said wiring, said source electrode is formed with a comb-like electrode parallel to said common electrode.

9. The active matrix substrate manufacturing method according to claim 3, wherein in said step of forming said first pattern, said first conductive film constitutes a gate wiring including a gate electrode, and said first pattern is formed in accordance with a TFT and said intersection portion of said drain electrode formed in a later step and said gate wiring;
in said step of forming said second pattern, said second pattern is formed as said gate wiring excluding said gate electrode and said intersection portion, and a drain lower wiring which is formed between said intersection portions under said drain wiring by a later step;
in said step of forming said third pattern, said second conductive film of said third pattern constitutes a pixel electrode surrounded by said gate wiring and said drain wiring, a gate terminal electrode and a drain terminal electrode, and said pixel electrode is formed on said gate wiring so as to partially overlap on said gate wiring with said interlayer insulating film constituting said third pattern sandwiched therebetween;
in said step of forming said fourth pattern, a contact through hole at which said interlayer insulating film is opened is also formed on said drain lower wiring; and
in said step of forming said wiring, a drain electrode consisting of said third conductive film connected to said semiconductor film through a contact through hole formed on said semiconductor film constituting said TFT is formed, a drain wiring connected to said drain lower wiring is formed through said contact through hole formed on said drain lower wiring, a source electrode consisting of said third conductive film connected to said semiconductor film through a contact through hole different from said contact through hole formed on said semiconductor film constituting said TFT is formed, a gate wiring drawing electrode connected said gate wiring through a contact through hole formed on said gate wiring is formed, said drain wiring is formed crossing over said intersection portion and in contact with the periphery of said drain terminal electrode, said source electrode is formed partially in contact with said pixel electrode, and said gate wiring drawing electrode is formed in contact with the periphery of said gate terminal electrode.

10. The active matrix substrate manufacturing method according to claim 1, wherein said step of forming said second pattern is followed by the steps of:
depositing an interlayer insulating film covering said first pattern and said second pattern after removing said first remaining resist mask;
opening said interlayer insulating film to form a contact through hole on said first pattern and said second pattern; and
forming a wiring on said interlayer insulating film to connect said first pattern and said second pattern with said wiring through said contact through hole.

11. The active matrix substrate manufacturing method according to claim 1, wherein said step of forming said second pattern is followed by the steps of:
depositing an interlayer insulating film covering said first pattern and said second pattern, and opening a part of said interlayer insulating film on said first pattern and said second pattern to form each contact through hole on said first pattern and said second pattern, after removing said first remaining resist mask;
sequentially depositing a fourth conductive film, a fifth conductive film and a protection insulating film so as to cover said interlayer insulating film to form a third laminated film, and forming a third resist mask consisting of a third thick resist portion having a large film thickness and a third thin resist portion having a film thickness smaller than that of said third thick resist portion on said protection insulating film;
etching said third laminated film on said interlayer insulating film with said third resist mask as a mask to form a fifth pattern consisting of said third laminated film covering said contact through holes on said first pattern and said second pattern;
etching said third resist mask and removing said third thin resist portion to form a third remaining resist mask having said third thick resist portion remaining on said fifth pattern, and exposing a part of said fifth pattern at least in an area excluding the vicinity of said contact through holes; and
etching an exposed part of said fifth pattern with said third remaining resist mask as a mask and removing said protection insulating film and said fifth conductive film to expose a part of a surface of said fourth conductive film.

12. The active matrix substrate manufacturing method according to claim 11, wherein in said step of forming said first pattern, said first conductive film constitutes a gate wiring including a gate electrode, and said first pattern is formed in accordance with a TFT and an intersection portion of a drain wiring formed in a later step and said gate wiring;
in said step of forming said second pattern, said second pattern is formed in accordance with said gate wiring excluding said gate electrode and said intersection portion;
in said step of forming said contact through hole, said contact through hole is formed on said semiconductor film of said TFT and on said gate wiring; and
in said step of exposing a part of the surface of said fourth conductive film, said fourth conductive film is exposed in areas of a gate terminal electrode, a drain terminal electrode and a pixel electrode surrounded by said gate wiring and said drain wiring.

* * * * *